(12) United States Patent
Morita et al.

(10) Patent No.: US 11,444,383 B2
(45) Date of Patent: Sep. 13, 2022

(54) ANTENNA DEVICE, ANTENNA SYSTEM, AND INSTRUMENTATION SYSTEM

(71) Applicant: MORITA TECH CO., LTD., Kawasaki (JP)

(72) Inventors: Osamu Morita, Kawasaki (JP); Akinori Saeki, Kawasaki (JP); Satoshi Ogura, Kawasaki (JP)

(73) Assignee: MORITA TECH CO., LTD., Kawasaki (JP)

( * ) Notice: Subject to any disclaimer, the term of this patent is extended or adjusted under 35 U.S.C. 154(b) by 158 days.

(21) Appl. No.: 16/763,336

(22) PCT Filed: Jul. 17, 2018

(86) PCT No.: PCT/JP2018/026712
§ 371 (c)(1),
(2) Date: May 12, 2020

(87) PCT Pub. No.: WO2019/102646
PCT Pub. Date: May 31, 2019

(65) Prior Publication Data
US 2020/0335872 A1    Oct. 22, 2020

(30) Foreign Application Priority Data

Nov. 24, 2017  (JP) .............................. JP2017-225644
May 10, 2018  (JP) .............................. JP2018-091195

(51) Int. Cl.
*H01Q 13/02*    (2006.01)
*H01P 11/00*    (2006.01)
(Continued)

(52) U.S. Cl.
CPC ............... *H01Q 13/02* (2013.01); *H01P 1/17* (2013.01); *H01P 11/00* (2013.01); *H01Q 1/243* (2013.01)

(58) Field of Classification Search
CPC .......... H01Q 13/02; H01Q 1/243; H01P 1/17; H01P 11/00
(Continued)

(56) References Cited

U.S. PATENT DOCUMENTS 4,504,836 A * 3/1985 Seavey ................ H01Q 21/245
                                                    333/21 A
4,740,795 A * 4/1988 Seavey ..................... H01Q 5/45
                                                     343/762
(Continued)

FOREIGN PATENT DOCUMENTS

CN       106374231 A     2/2017
GB           635763 A     4/1950
(Continued)

OTHER PUBLICATIONS

Taiwanese Office Action and Search Report dated Oct. 26, 2020, issued in Taiwanese Application No. 107126421, 6pages.
(Continued)

*Primary Examiner* — Hai V Tran
(74) *Attorney, Agent, or Firm* — Masuvalley & Partners; Peter R. Martinez

(57) ABSTRACT

An object of the present invention is to suppress occurrence of disturbance in pass amplitude characteristics within a band and disturbance in return loss characteristics in the band due to total reflection, improve cutoff performance, and acquire a favorable gain. An antenna device 1 includes a waveguide body 5 including a coaxial waveguide conversion unit 6 that includes an inner space 8 and a connector attachment hole 22, and a closure member 30. The antenna device 1 also includes a connector 50 including a connector body 51, a center conductor 60, and a radiator 54 b config-
(Continued)

(a)

(b)

ured by an end portion 60 *a* of the center conductor that adapts the protruding length of the end portion to a specific frequency band.

14 Claims, 26 Drawing Sheets

(51) Int. Cl.
*H01Q 1/24* (2006.01)
*H01P 1/17* (2006.01)

(58) Field of Classification Search
USPC .......................................................... 343/786
See application file for complete search history.

(56) References Cited

U.S. PATENT DOCUMENTS

| | | | |
|---|---|---|---|
| 6,414,645 | B1 | 7/2002 | Dahlberg |
| 6,741,211 | B2 | 5/2004 | Toncich et al. |
| 2010/0033391 | A1* | 2/2010 | McLean ............... H01Q 13/085 343/786 |
| 2011/0109409 | A1* | 5/2011 | Lan ........................ H01P 1/161 333/248 |
| 2012/0160809 | A1* | 6/2012 | Ishibashi ........... H01J 37/32192 216/69 |
| 2013/0271235 | A1 | 10/2013 | Kai |
| 2015/0048980 | A1 | 2/2015 | Chin |
| 2015/0270616 | A1* | 9/2015 | Jafarlou ................ H01Q 13/02 29/601 |
| 2016/0126051 | A1* | 5/2016 | Duan ...................... H01J 25/34 315/39 |
| 2017/0338569 | A1 | 11/2017 | Hower et al. |

FOREIGN PATENT DOCUMENTS

| | | |
|---|---|---|
| JP | S53-129563 A | 11/1978 |
| JP | S64-7403 U | 1/1989 |
| JP | H05-22016 A | 1/1993 |
| JP | H05-121912 A | 5/1993 |
| JP | H11-330845 A | 11/1999 |
| JP | 2000-049501 A | 2/2000 |
| JP | 2003-133815 A | 5/2003 |
| JP | 2006-258762 A | 9/2006 |
| JP | 2008-282706 A | 11/2008 |
| JP | 2009-085721 A | 4/2009 |
| JP | 2011-120155 A | 6/2011 |
| JP | 2014-007456 A | 1/2014 |
| TW | 201507376 A | 2/2015 |
| WO | WO2012/101699 A1 | 8/2012 |
| WO | WO2016/016968 A1 | 2/2016 |

OTHER PUBLICATIONS

WIPO, Japan Patent Office International Search Authority, International Search Report (with English translation) and Written Opinion dated Sep. 11, 2018 in International Patent Application No. PCT/JP2018/026712, 8 pages.

EPO, The extended European search report dated Jun. 25, 2021 in European Application No. EP18881756.3, 8 pages.

* cited by examiner

FIG.2
(a)
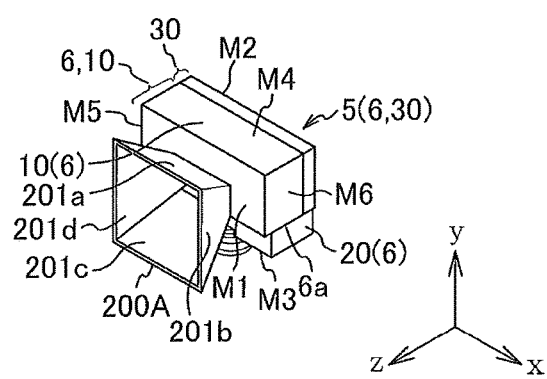
(b)
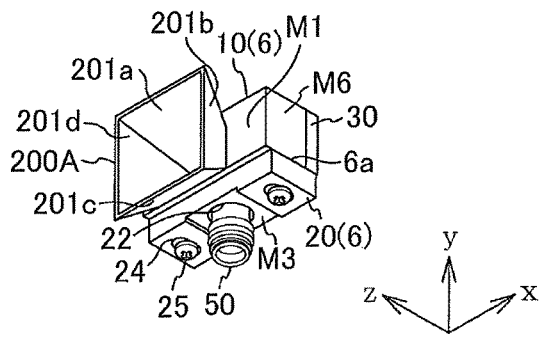
FIG.3
(a)
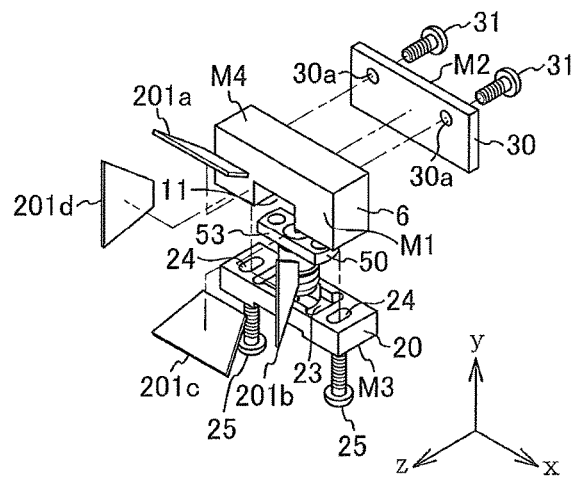
(b)
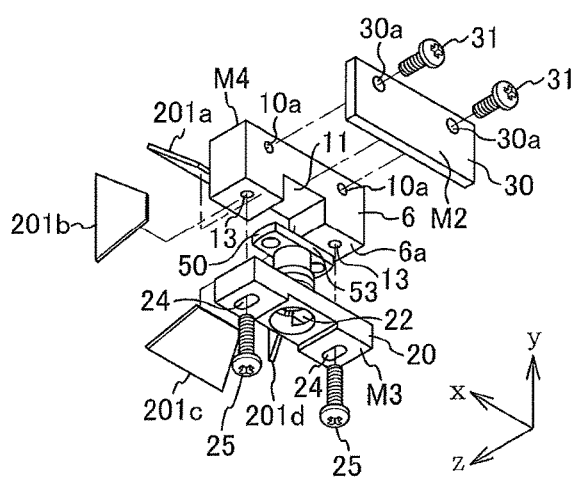

FIG.8
(a)
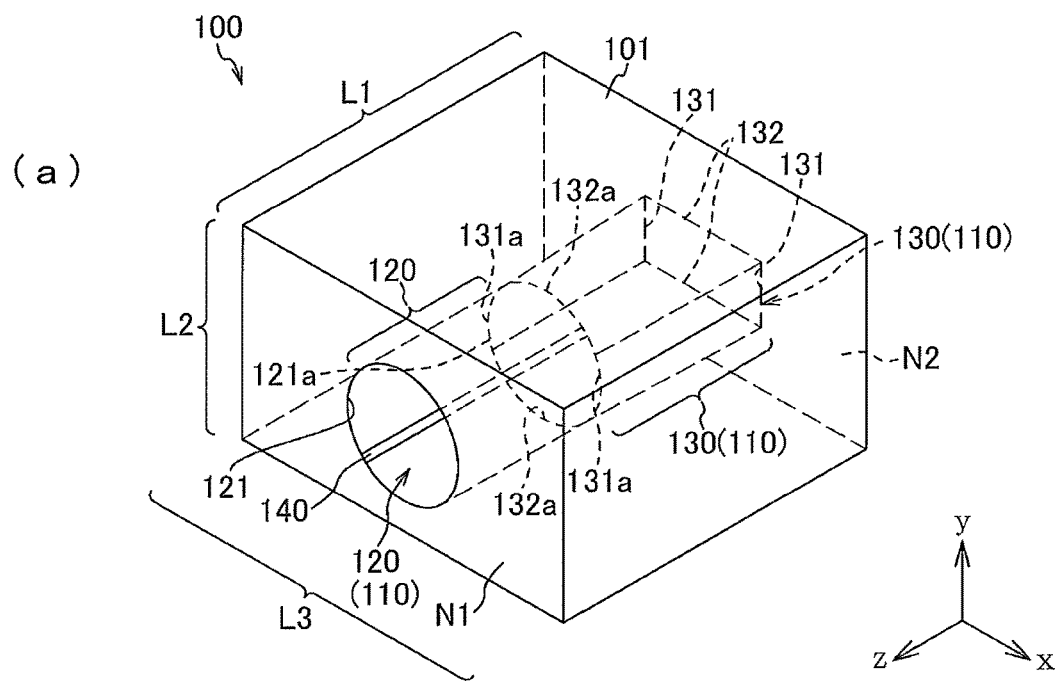
(b)
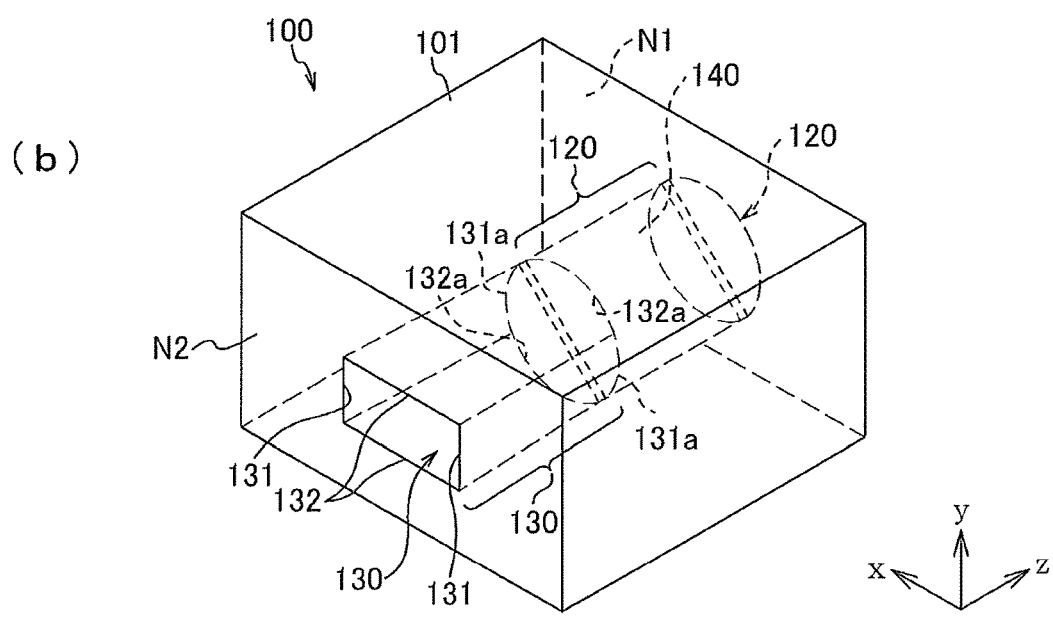

FIG.9
(a)
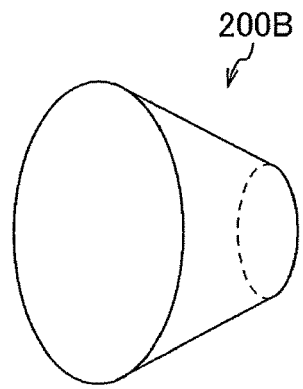
200B
(b)　　　(c)　　　(d)
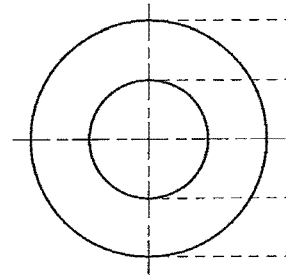 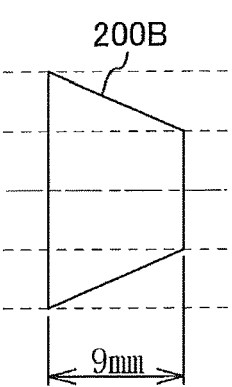 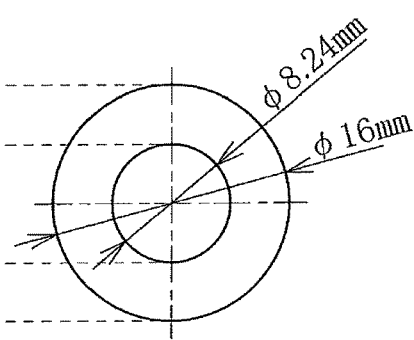
200B, 9mm, φ8.24mm, φ16mm
(e)　　　(f)　　　(g)
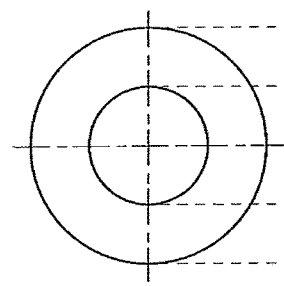 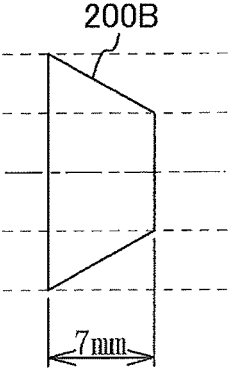 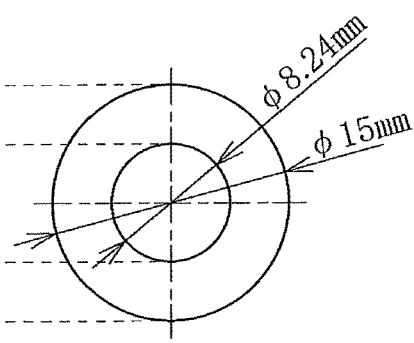
200B, 7mm, φ8.24mm, φ15mm FIG.10
(a)
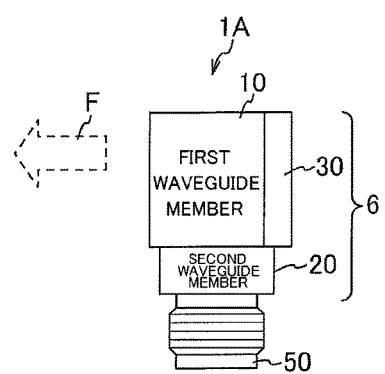
(b)
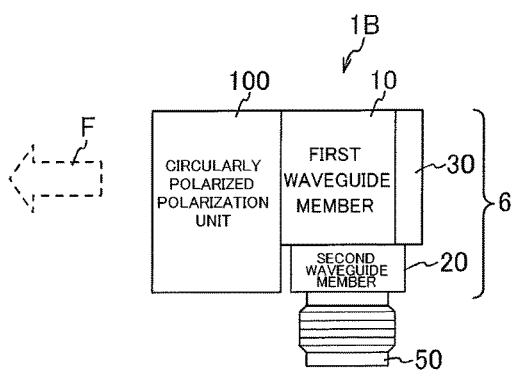
(c)
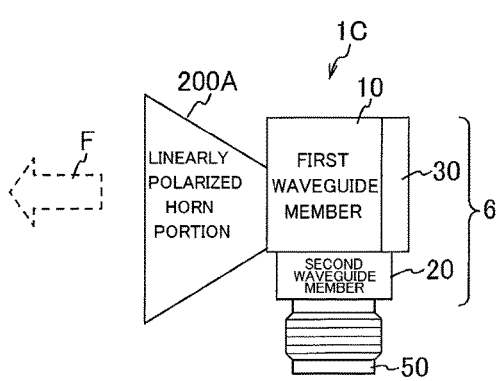
(d)
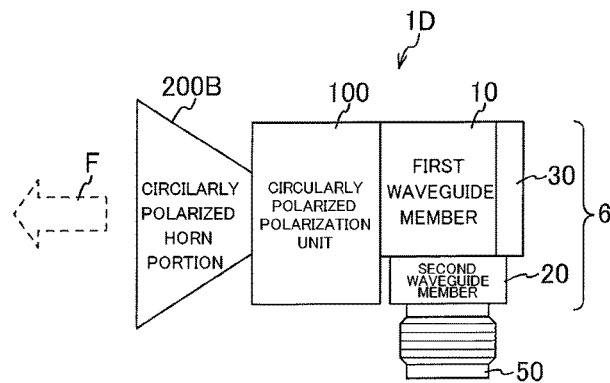

FIG.11

| SPECIFIC NAME OF ANTENNA DEVICE | HORN PORTION | | POLARIZATION UNIT | COAXIAL WAVEGUIDE CONVERSION UNIT | CONNECTOR |
|---|---|---|---|---|---|
| | LINEARLY POLARIZED HORN PORTION | CIRCULARLY POLARIZED HORN PORTION | CIRCULARLY POLARIZED POLARIZATION UNIT | | |
| LINEAR POLARIZATION COUPLER | | | | ○ | ○ |
| CIRCULAR POLARIZATION COUPLER | | | ○ | ○ | ○ |
| LINEARLY POLARIZED HIGH-GAIN HIGH-ISOLATION COUPLER | ○ | | | ○ | ○ |
| CIRCULARLY POLARIZED HIGH-GAIN HIGH-ISOLATION COUPLER | | ○ | ○ | ○ | ○ |

FIG.12
(a)
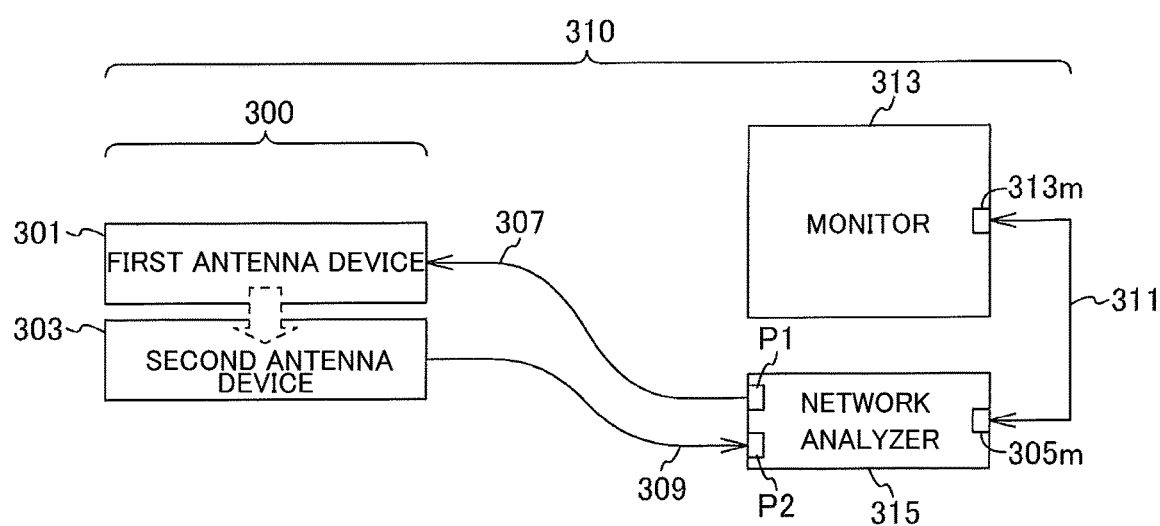
(b)
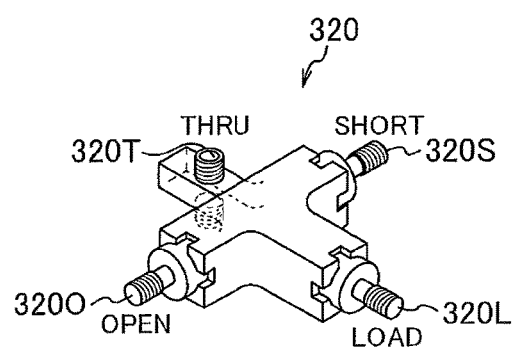

FIG.15
(a) COAXIAL WAVEGUIDE CONVERSION UNIT
REPRESENTATIVE CHARACTERISTICS IMMEDIATELY AFTER ASSEMBLY
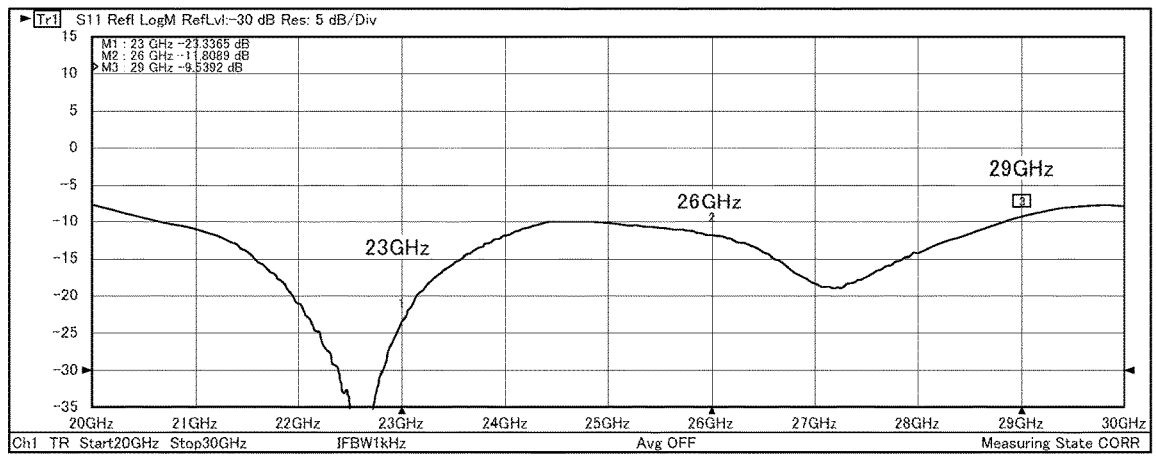
(b) COAXIAL WAVEGUIDE CONVERSION UNIT
REPRESENTATIVE CHARACTERISTICS AFTER ADJUSTMENT
ADJUST TARGET FREQUENCY OF 23 GHz TO 29 GHz BAND TO NEAR −15 dB
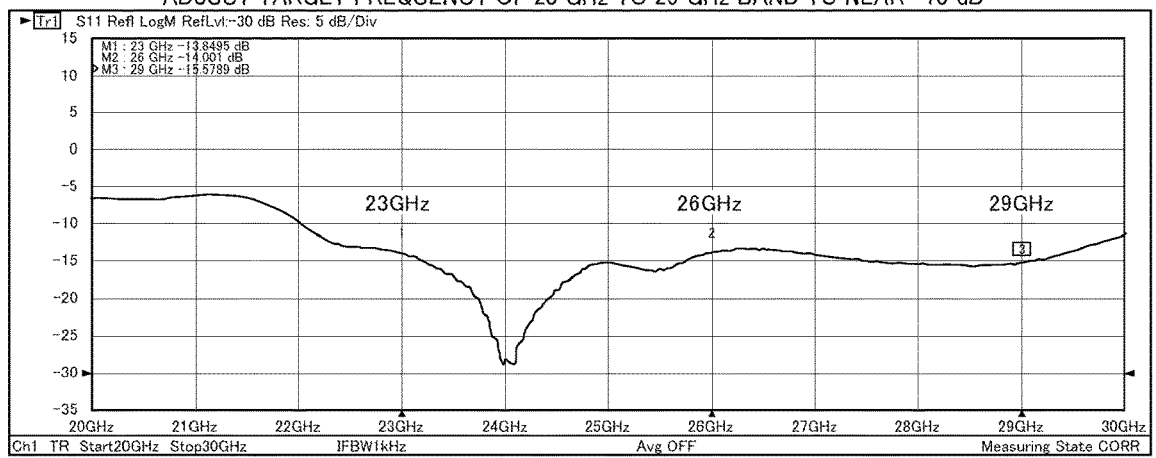

FIG.17
(a)
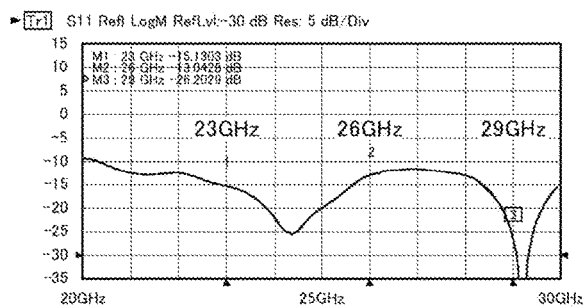
(b)
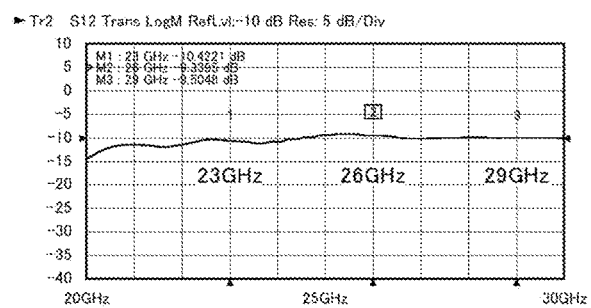
(c)
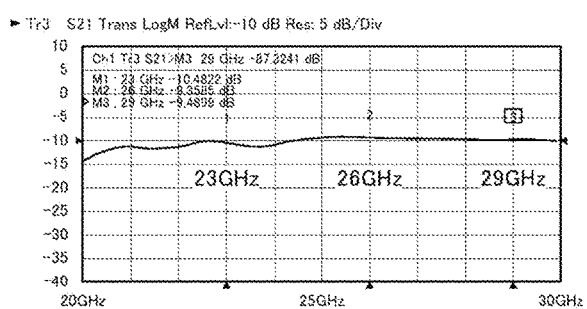
(d)
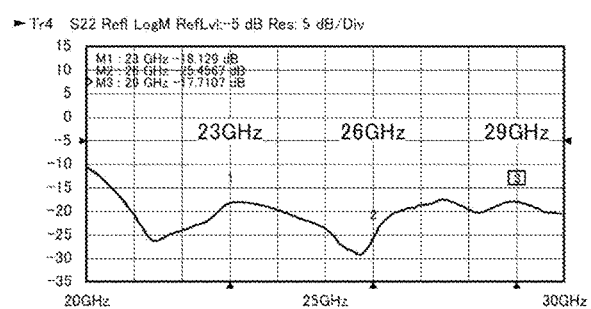

FIG.22
(a)
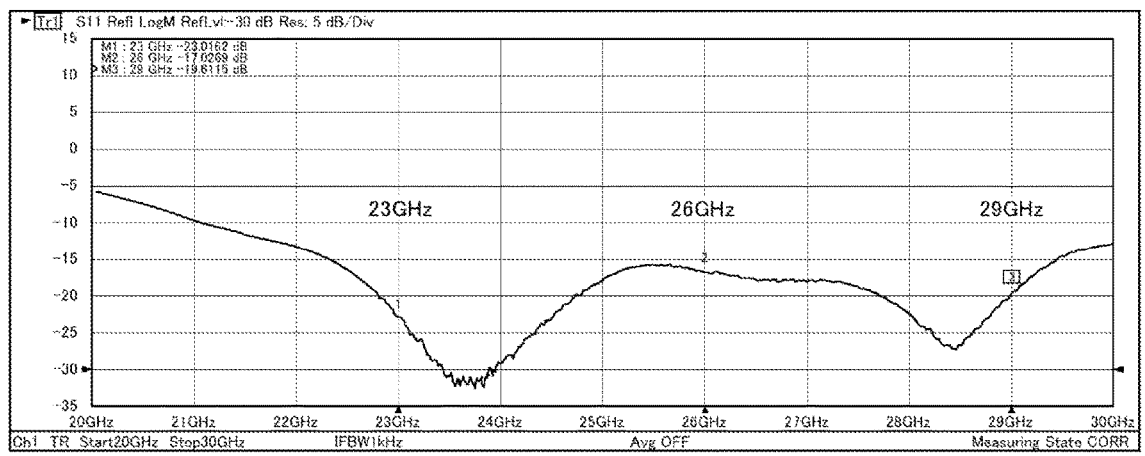
(b)
COUPER COUPLING CHARACTERISTICS (PASS AMPLITUDE CHARACTERISTICS)
COUPLING DISTANCE 0 mm
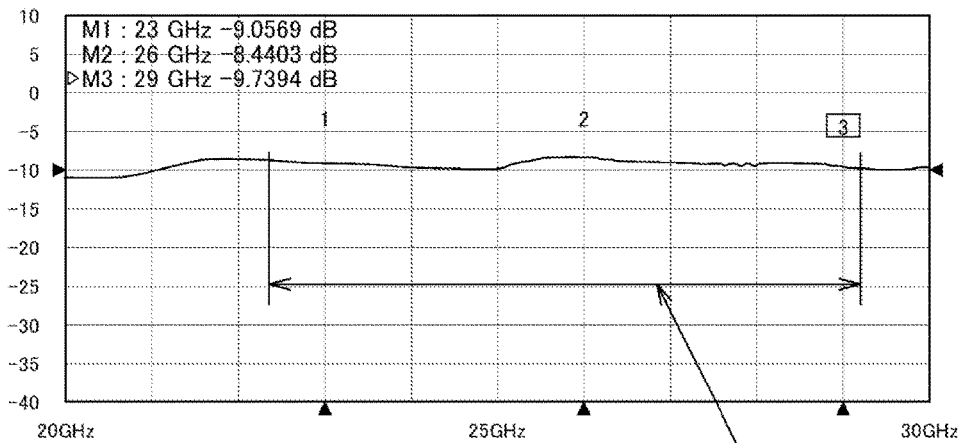
COUPLING WITHIN BAND INDICATES SUBSTANTIALLY FLAT CHARACTERISTICS

FIG.23
(a)
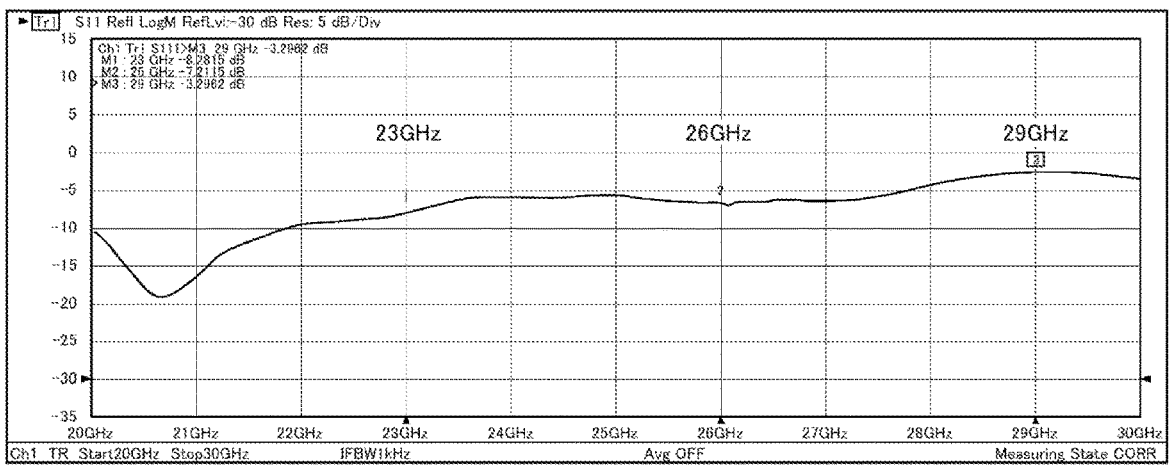
(b)
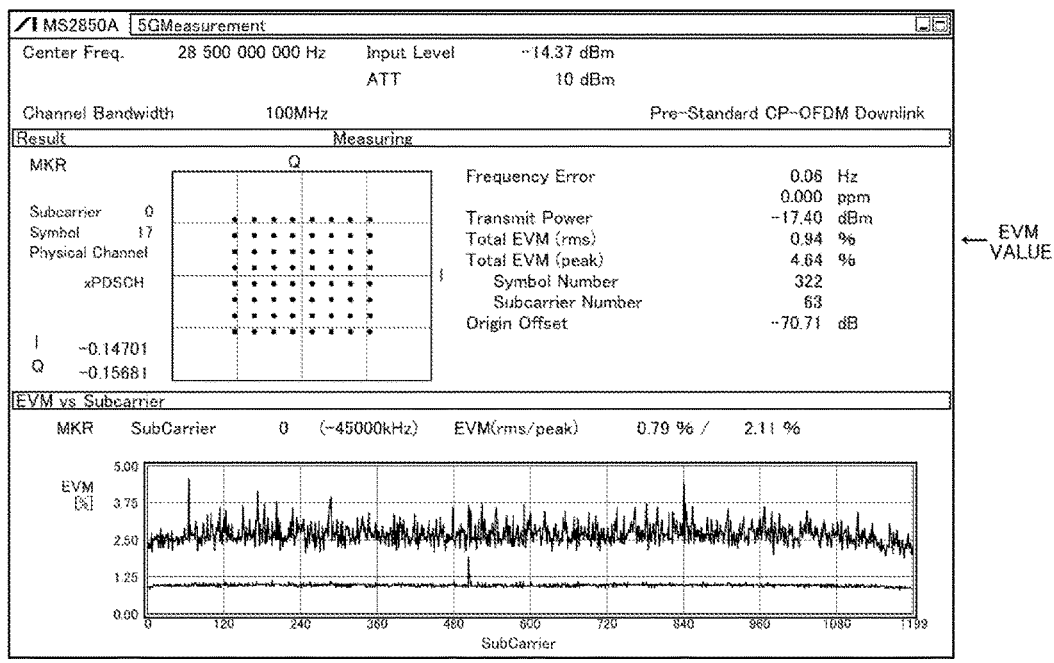

FIG.24
(a)
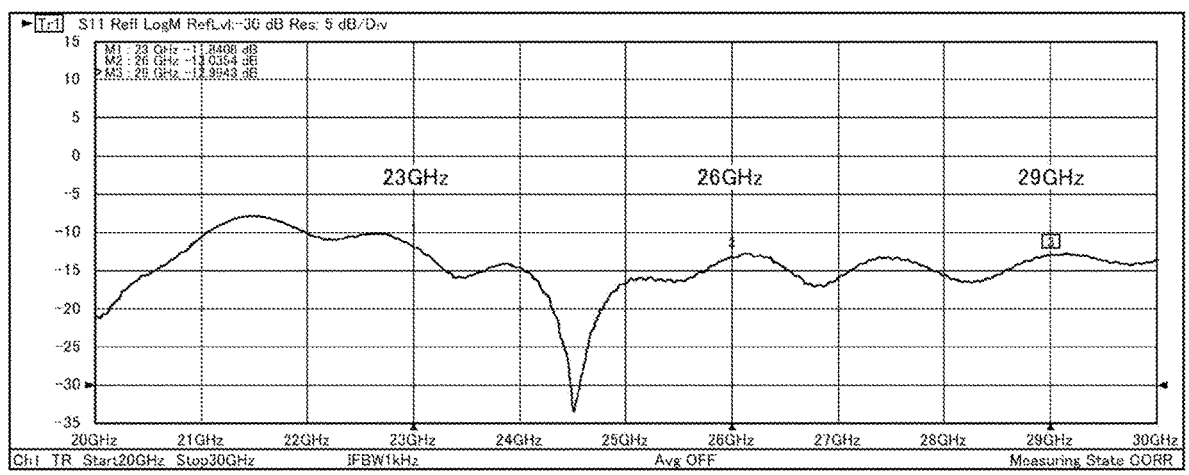
(b)
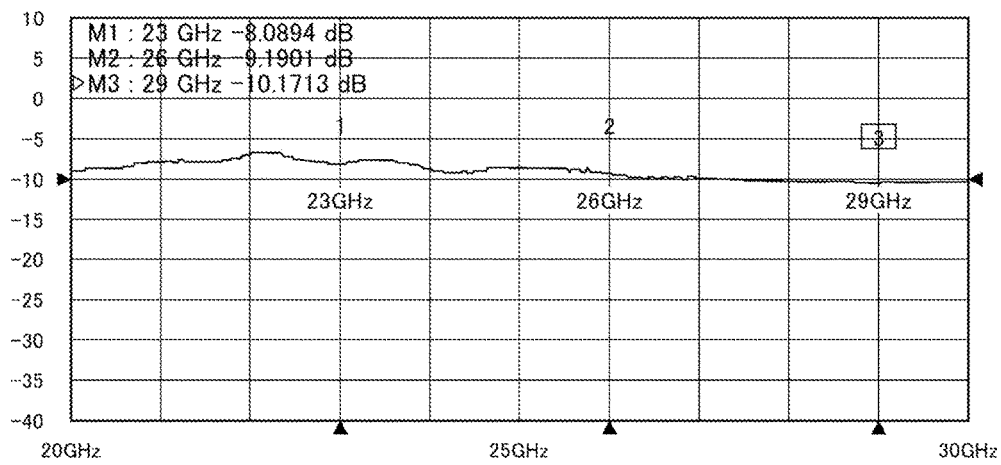

FIG.25
(a)
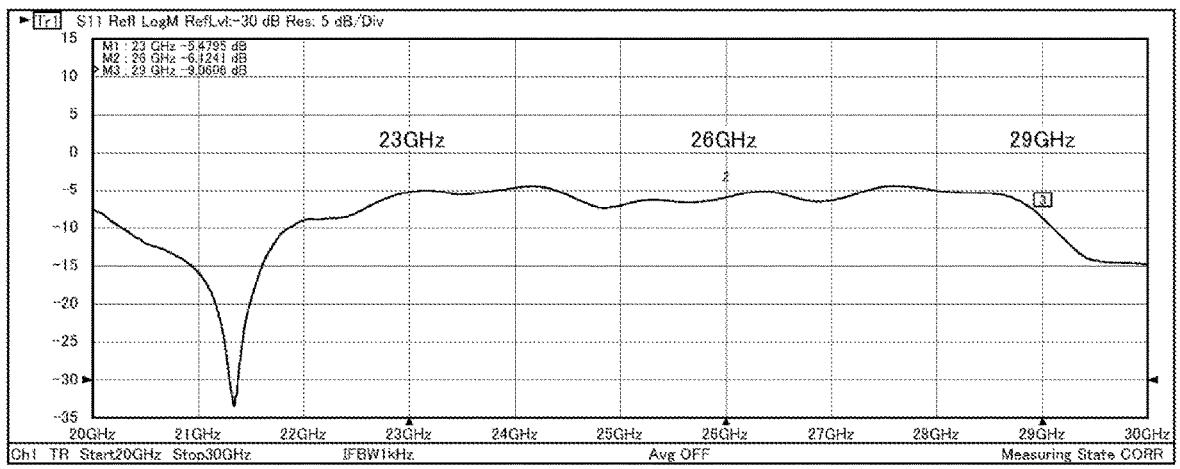
(b)
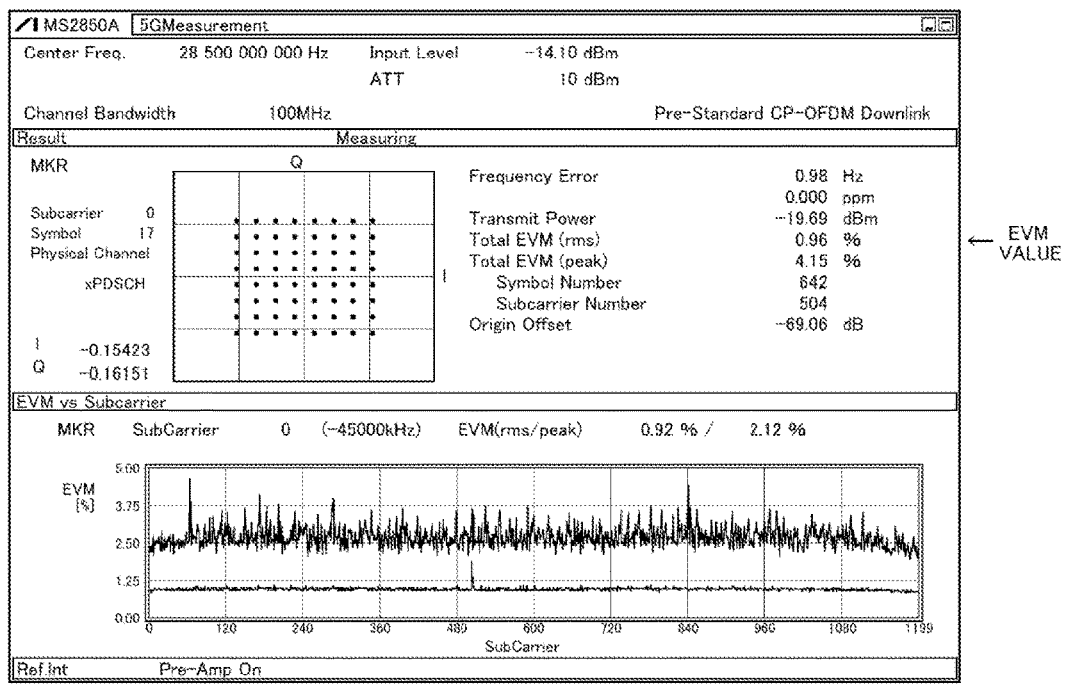

FIG.26
LARGE PROTOTYPE No. 1 VSWR CHARACTERISTICS
(a)
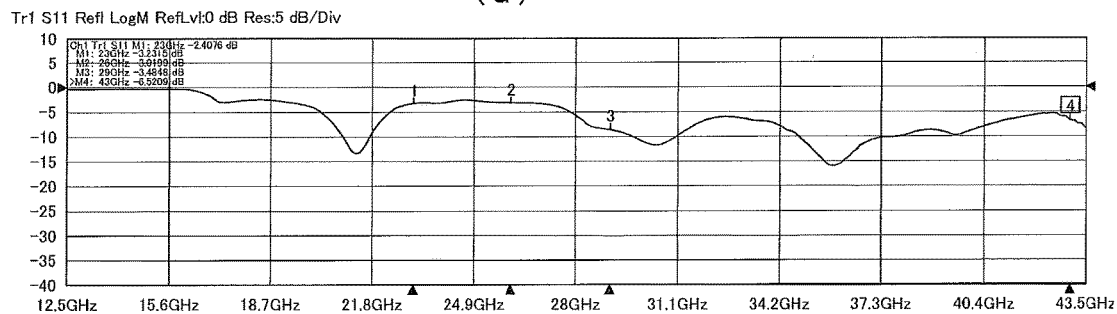
(b)
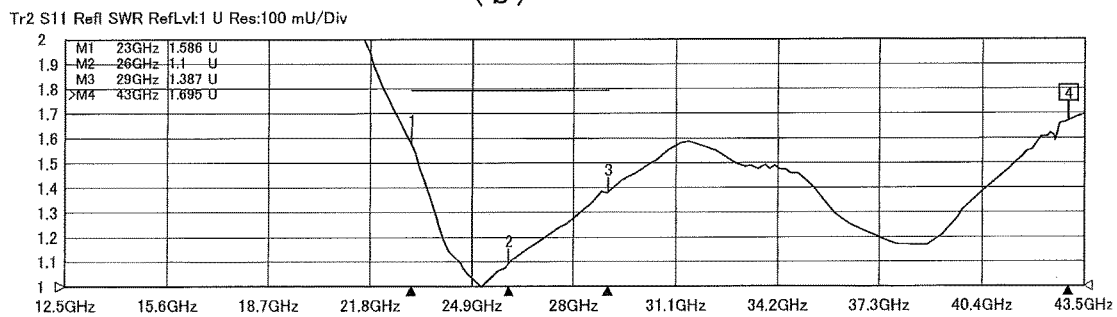
LARGE PROTOTYPE No. 1 - LARGE PROTOTYPE No. 2 OPPOSING CHARACTERISTICS (CLOSENESS)
(c)
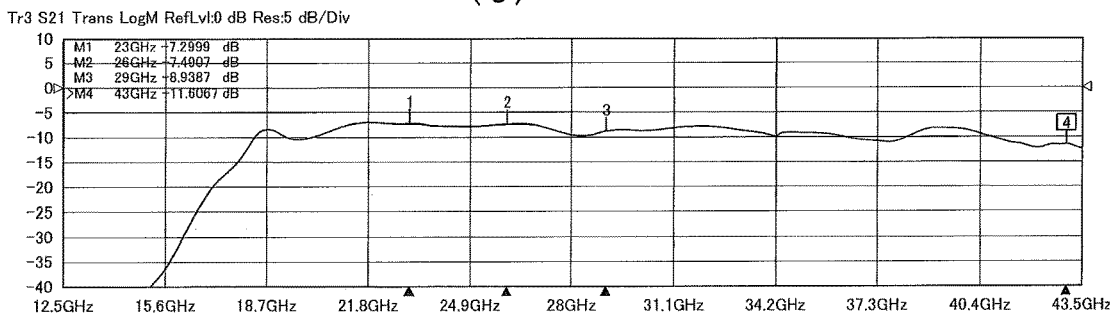

FIG.27
(a)
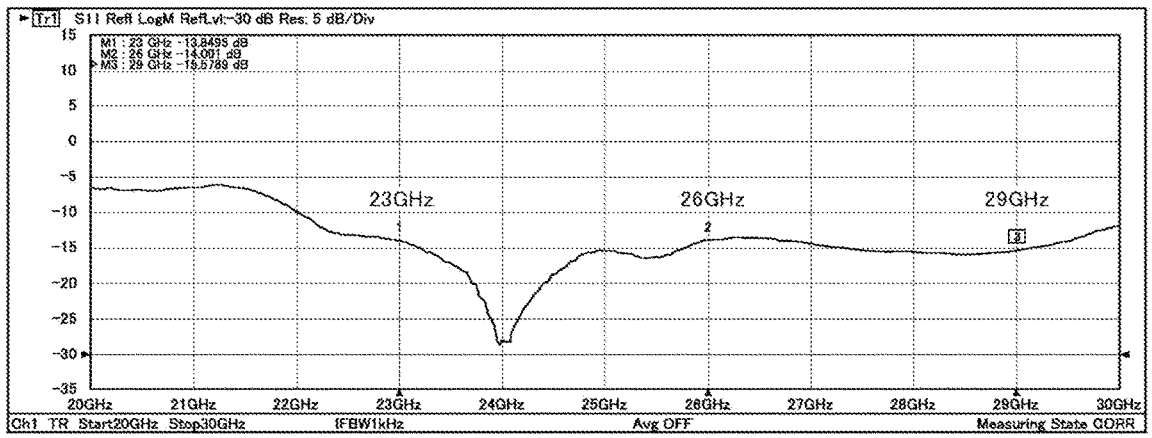
(b)
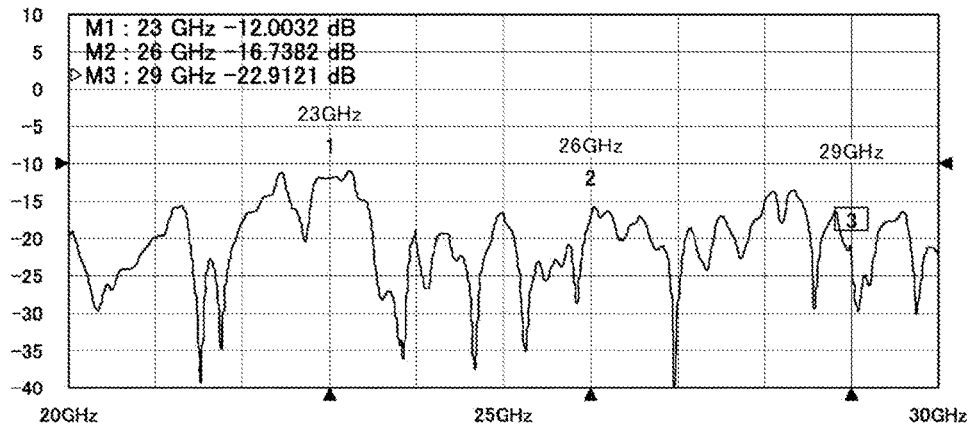
(c)
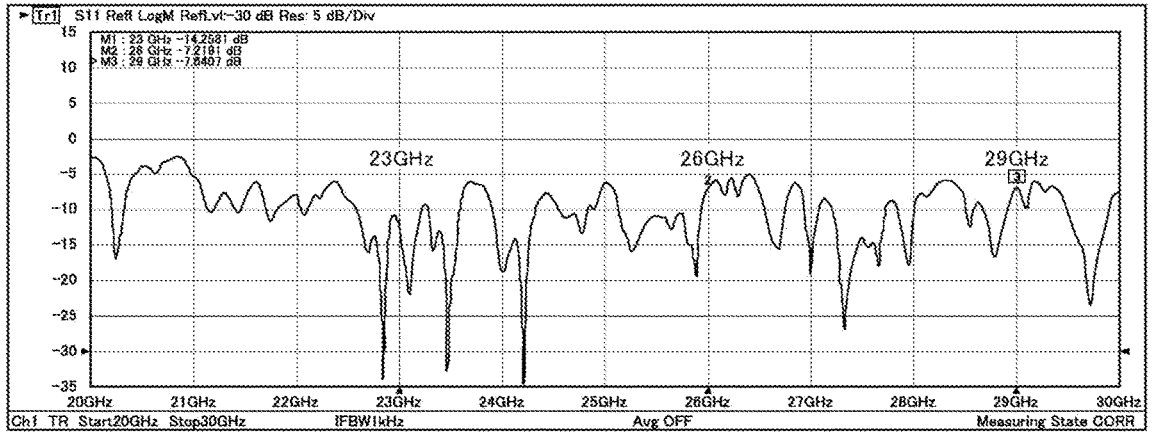

ANTENNA DEVICE, ANTENNA SYSTEM, AND INSTRUMENTATION SYSTEM

RELATED APPLICATIONS

This application is the U.S. National Phase of and claims priority to International Patent Application No. PCT/JP2018/026712, International Filing Date Jul. 17, 2018, entitled Antenna Device, Antenna System, And Instrumentation System; which claims benefit of Japanese Application No. JP2017-225644 filed Nov. 24, 2017; and Japanese Application No. JP2018-091195 filed May 10, 2018; all of which are incorporated herein by reference in their entireties.

FIELD

The present invention relates to an antenna device, an antenna system, and an instrumentation system of a digital modulation device.

BACKGROUND

In recent years, a digital modulation device has become popular as a mobile terminal such as a cell phone and a smartphone. A coupler antenna has been used to measure various properties with respect to high-frequency waves of an object to be measured, by approaching to or closely adhering to the object to be measured to perform radio wave transmission and reception.

In a coupler antenna for such application, to correspond to a frequency band to be measured, a patch antenna in which a plurality of element patterns are formed on the entire surface of a tabular dielectric substrate has been adopted.

For example, a horn antenna in which a horn is attached to a front surface of such a conventional patch antenna has been known. Results of three types of measurements performed with respect to such horn antenna are illustrated in FIGS. 27(a) to (c).

FIG. 27(a) is a graph illustrating return loss characteristics (return loss) when the horn antenna is arranged in a free space.

FIG. 27(b) is a graph illustrating coupler coupling characteristics (pass amplitude characteristics) measured in a case in which a pair of horn antennas are arranged opposite to each other and coupled with a coupling distance of 0 millimeter.

When the coupler coupling characteristics (pass amplitude characteristics) are measured, level fluctuations of, for example, −30 decibels or more occur irregularly as steep disturbance of waveforms, in a target frequency band (23 GHz to 29 GHz).

FIG. 27(c) is a graph illustrating return loss characteristics (return loss) in total reflection, measured in a case in which the entire surface of the horn antenna is covered with a metallic plate.

When the return loss characteristics (return loss) are measured, steep disturbance of waveforms occur irregularly within the band due to total reflection.

Patent Literature 1 has been disclosed regarding such a patch antenna.

Patent Literature 1 discloses a configuration in which a transmission antenna and a plurality of reception antennas each include a substrate having a dielectric property, a circularly polarized antenna element arranged on a principal surface of the substrate, a ground layer formed on a rear surface of the substrate, a strip conductor surrounding the antenna element and arranged on the principal surface of the substrate, and a plurality of connection conductors formed in such a manner that a plurality of through holes that penetrate from a region where the strip conductor is formed on the principal surface of the substrate to the rear surface of the substrate are arranged at predetermined intervals, to electrically connect the ground layer and the strip conductor via each through hole. An inner edge of the strip conductor protrudes toward the antenna element side than an inner wall of each through hole. With this configuration, it can be suppressed that surface waves are generated on the principal surfaces of the substrate of the transmission antenna and the reception antennas, so that radiation characteristics of each antenna have a desired stable shape.

CITATION LIST

Patent Literature

Patent Literature 1: Japanese Patent Application Laid-open No. 2006-258762

SUMMARY

Technical Problem

A conventional patch antenna has such a structure that a plurality of elements having a specific pattern matched with a target frequency are arranged on a substrate.

Therefore, characteristic variations of respective elements and mutual interference between respective elements occur, thereby causing problems such that irregular disturbance in pass amplitude characteristics within a band as illustrated in FIG. 28(b), and irregular disturbance in return loss characteristics within the band due to total reflection as illustrated in FIG. 28(c) occur.

Further, since the elements having a specific pattern are arranged on the substrate, it is difficult to exclude radio waves coming from the rear surface of the substrate and the environment thereof, thereby causing a problem such that required cutoff performance decreases.

In view of the above circumstances, an object of the present invention is to provide an antenna device that can suppress occurrence of disturbance in pass amplitude characteristics within a band and disturbance in return loss characteristics within the band due to total reflection, can improve cutoff performance, and can acquire a favorable EVM value.

Solution to Problem

In order to solve the above problems, the invention according to claim 1 comprises: a waveguide body including a coaxial waveguide conversion unit that is hexahedral and is made of a conductive material and including an inner space formed by penetrating a first surface and a second surface facing each other, and a connector attachment hole for inserting a coaxial connector continuously formed between a third surface orthogonal to the first surface and the second surface and the inner space, and a closure member that is conductive and that closes an opening of the inner space on the second surface side; and a connector including a connector body that is conductive and is attached to the connector attachment hole from the inner space toward outside, with an inner end thereof not protruding into the inner space, a center conductor arranged to axially penetrate a central portion of the connector body, with an end portion thereof protruding from an inner end of the connector body into the inner space by a predetermined length, and a radiator configured by the end portion of the center conductor protruding into the inner space, to radiate radio waves from the center conductor into the inner space by adapting the protruding length of the end portion to a specific frequency band.

Advantageous Effects of Invention

According to the present invention, it is possible to suppress occurrence of disturbance in pass amplitude characteristics within a band and disturbance in return loss characteristics within the band due to total reflection, improve cutoff performance, and acquire a favorable EVM value.

BRIEF DESCRIPTION OF DRAWINGS

FIGS. 2(a) and (b) are perspective views respectively illustrating the structure of the antenna device according to the embodiment of the present invention.

FIGS. 3(a) and (b) are exploded perspective views respectively illustrating the structure of the antenna device according to the embodiment of the present invention.

FIGS. 8(a) and (b) are respectively an external perspective view on a front side and a back side of the circularly polarized type polarization unit.

FIG. 9(a) is an external perspective view illustrating a circularly polarized horn portion 200B of the antenna device according to another embodiment (16-mm horn) of the present invention, FIG. 9(b) is a front view, FIG. 9(c) is a side view, and FIG. 9(d) is a back view thereof, while FIGS. 9(e), (f), and (g) are respectively a front view, a side view, and a back view of the circularly polarized horn portion 200B of the antenna device according to the other embodiment (15-mm horn) of the present invention.

FIGS. 10(a) to (d) are side views illustrating modifications of the antenna device according to the embodiment of the present invention.

FIG. 11 is a table illustrating a configuration of the modifications of the antenna device according to the embodiment of the present invention.

FIG. 12(a) is a block diagram illustrating an antenna system and an instrumentation system using the antenna device according to the embodiment of the present invention, and FIG. 12(b) is a perspective view illustrating a calibration kit to be used for calibration of the instrumentation system.

FIGS. 15(a) and (b) are graphs respectively illustrating representative characteristics immediately after assembly, and representative characteristics after adjustment of a linear polarization coupler.

FIGS. 17(a) to (d) are graphs illustrating results of measurement of return loss characteristics and coupling characteristics, performed in the instrumentation system.

FIG. 22(a) is a graph illustrating a result of measurement of return loss characteristics in a free space of a linear polarization coupler, performed in the instrumentation system, while FIG. 22(b) is a graph illustrating a result of measurement of coupler coupling characteristics (pass amplitude characteristics) of the linear polarization coupler, performed in the instrumentation system.

FIG. 23(a) is a graph illustrating a result of measurement of return loss characteristics in total reflection of the linear polarization coupler, performed in the instrumentation system, while FIG. 23(b) is a graph illustrating a result of measurement of the EVM value of the linear polarization coupler, performed in the instrumentation system.

FIG. 24(a) is a graph illustrating a result of measurement of return loss characteristics of the linearly polarized high-gain high-isolation coupler in a free space, performed in the instrumentation system, while FIG. 24(b) is a graph illustrating a result of measurement of coupler coupling characteristics (pass amplitude characteristics) of the linearly polarized high-gain high-isolation coupler, performed in the instrumentation system.

FIG. 25(a) is a graph illustrating a result of measurement of return loss characteristics in total reflection of the linearly polarized high-gain high-isolation coupler, performed in the instrumentation system, while FIG. 25(b) is a graph illustrating a result of measurement of the EVM value of the linearly polarized high-gain high-isolation coupler, performed in the instrumentation system.

FIG. 26(a) is a graph illustrating a result of measurement of return loss characteristics in total reflection of the linearly polarized high-gain high-isolation coupler, performed in the instrumentation system after fine adjustment is performed, while FIG. 26(b) is a graph illustrating a result of measurement of VSWR characteristics of the linearly polarized high-gain high-isolation coupler, performed in the instrumentation system after fine adjustment is performed, and FIG. 26(c) is a graph illustrating a result of measurement of coupler coupling characteristics (pass amplitude characteristics) of the linearly polarized high-gain high-isolation coupler, performed in the instrumentation system after fine adjustment is performed.

FIG. 27(a) is a graph illustrating return loss characteristics (return loss) when a horn antenna is arranged in a free space, while FIG. 27(b) is a graph illustrating coupler coupling characteristics (pass amplitude characteristics) measured in a case in which a pair of horn antennas are arranged opposite to each other and coupled with a coupling distance of 0 millimeter, and FIG. 27(c) is a graph illustrating return loss characteristics (return loss) in total reflection, measured in a case in which the entire surface of the horn antenna is covered with a metallic plate.

DESCRIPTION OF EMBODIMENTS

Figure 1:
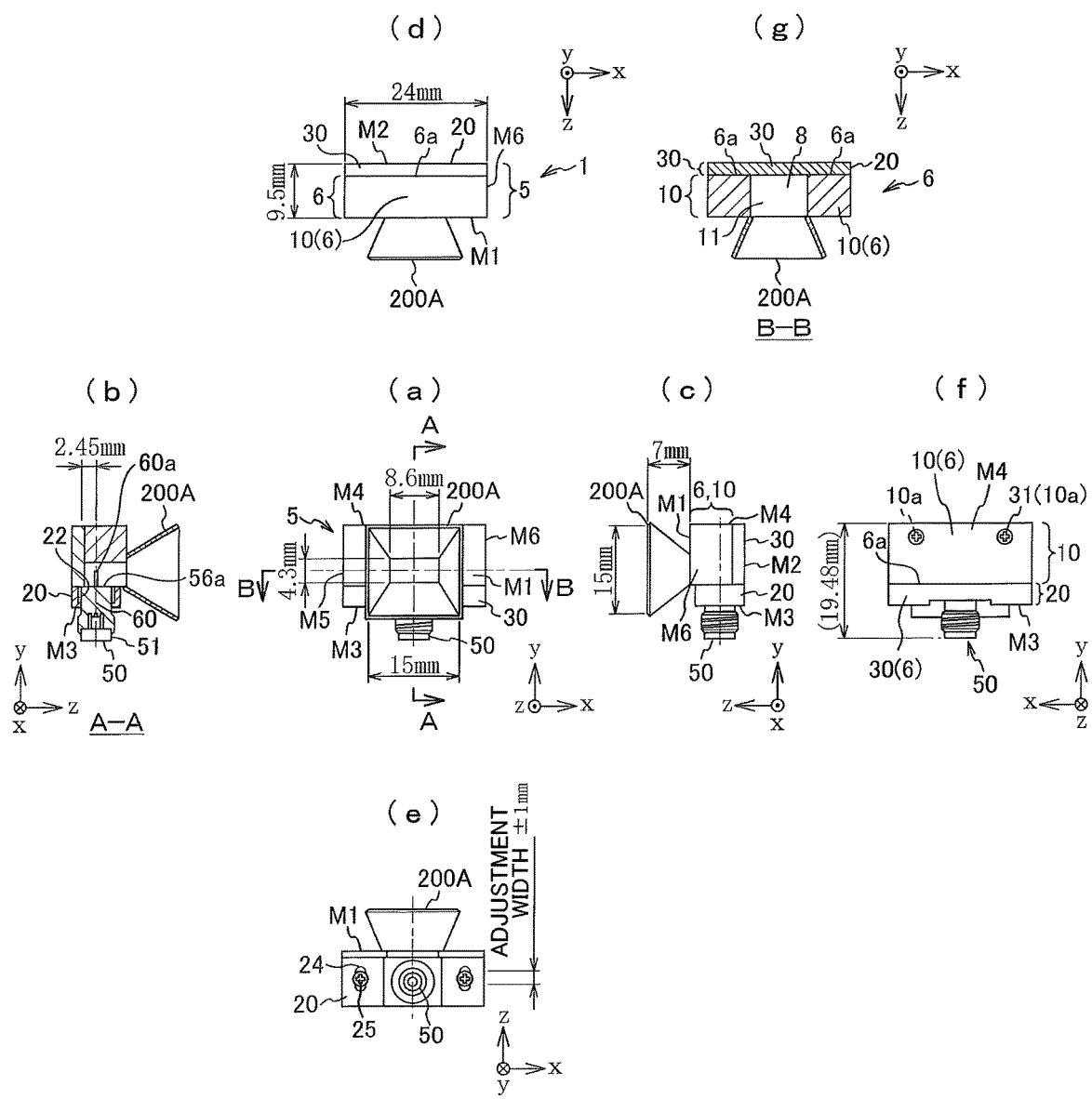
FIG. 1(a) is a front view illustrating the structure of an antenna device according to one embodiment of the present invention.
FIG. 1(b) is a sectional view along A-A in FIG. 1(a)
FIG. 1(c) is a right side view.
FIG. 1(d) is a top view.
FIG. 1(e) is a bottom view.
FIG. 1(f) is a back view.
FIG. 1(g) is a sectional view along B-B in FIG. 1(a).

The present invention will be described below in detail with an embodiment illustrated in the drawings.

The present invention has the following configurations in order to suppress occurrence of disturbance in pass amplitude characteristics within a band and disturbance in return loss characteristics within the band due to total reflection, to improve cutoff performance, and to acquire a favorable gain.

That is, an antenna device 1 according to the present invention comprises: a waveguide body including a coaxial waveguide conversion unit that is hexahedral and is made of a conductive material and including an inner space formed by penetrating a first surface and a second surface facing each other, and a connector attachment hole for inserting a coaxial connector continuously formed between a third surface orthogonal to the first surface and the second surface and the inner space, and a closure member 30 that is conductive and that closes an opening of the inner space on the second surface side; and a connector including a connector body that is conductive and is attached to the connector attachment hole from the inner space toward outside, with an inner end thereof not protruding into the inner space, a center conductor arranged to axially penetrate a central portion of the connector body, with an end portion thereof protruding from an inner end of the connector body into the inner space by a predetermined length, and a radiator configured by the end portion of the center conductor protruding into the inner space, to radiate radio waves from the center conductor into the inner space by adapting the protruding length of the end portion to a specific frequency band.

With the above configuration, occurrence of disturbance in pass amplitude characteristics within the band and disturbance in return loss characteristics within the band due to total reflection can be suppressed, cutoff performance can be improved, and a favorable EVM value can be acquired.

Features of the present invention described above will be described below in detail with reference to the drawings. Constituent elements, types, combinations, shapes, and relative arrangements described in the embodiment are merely explanatory examples, and are not intended to limit the scope of the present invention solely thereto unless otherwise specified.

The features of the present invention described above will be explained below in detail with reference to the drawings.

Next, the embodiment of the present invention is described with reference to the drawings.

<Structure of Antenna Device>

FIG. 1(a) is a front view illustrating the structure of an antenna device according to one embodiment of the present invention, (b) is a sectional view along A-A in (a), (c) is a right side view, (d) is a top view, (e) is a bottom view, (f) is a back view, and (g) is a sectional view along B-B in (a). FIGS. 2(a) and (b) are perspective views respectively illustrating the structure of the antenna device according to the embodiment of the present invention. FIGS. 3(a) and (b) are exploded perspective views respectively illustrating the structure of the antenna device according to the embodiment of the present invention. FIGS. 4(a), (b), and (c) are respectively a bottom view, a sectional view, and a top view of the connector according to the embodiment of the present invention.

In the following descriptions, it is assumed that the front view illustrated in FIG. 1(a) illustrates a basic coordinate system, the direction from left to right in the drawing is an x-axis direction, the direction orthogonal to the x-axis direction in the drawing is a y-axis direction, and (a vertical direction) orthogonal to the x-axis direction and the y-axis direction is a z-axis direction.

The antenna device 1 generally includes a waveguide body 5 formed to penetrate through central portions of first and second surfaces M1 and M2 facing each other and provided with an inner space 8 with an opening on the second surface side being closed, a connector 50 arranged in a connector attachment hole 22 formed to penetrate from an outer periphery (a third surface M3) different from the surfaces forming the inner space 8 to the inner space 8, with a radiator provided at one end thereof being exposed in the inner space 8, and a linearly polarized horn portion 200A connected to the first surface M1 side (a non-closed surface side) of the inner space 8 of the waveguide body 5. Instead of the linearly polarized horn portion 200A, the antenna device 1 also includes a circularly polarized type polarization unit 100 (FIG. 5) and a circularly polarized horn portion 200B connected to the non-closed surface side of the inner space via the circularly polarized type polarization unit 100.

The waveguide body 5 is schematically configured by a coaxial waveguide conversion unit 6 in a square block shape having a predetermined uniform thickness, and a closure member 30 in a thin-plate shape that closes one opening of the inner space 8 formed to penetrate through the coaxial waveguide conversion unit 6.

The coaxial waveguide conversion unit 6 and the closure member 30 are each made of a conductive material such as copper, iron, aluminum, brass, metamaterial, or plastic subjected to metal plating.

The coaxial waveguide conversion unit 6 is formed in a hexahedron made of a conductive material, and has the first surface M1 and the second surface M2 facing each other, the third surface M3 and a fourth surface M4 facing each other, and a fifth surface M5 and a sixth surface M6 facing each other.

The coaxial waveguide conversion unit 6 incudes a first waveguide member 10 provided with a concave portion 11, which becomes the inner space 8, on one surface 6a, and a second waveguide member 20 detachably attached to the one surface of the first waveguide member 10 to form the inner space 8 by closing the one surface side of the concave portion 11.

In FIGS. 3(a) and (b), a screw hole 13 having a circular shape is each formed at positions having the concave portion 11 provided therebetween on the one surface 6a of the first waveguide member 10, and long holes 24 extending parallel to the z-axis direction of the inner space 8 each formed at a position in the second waveguide member 20 coming into alignment with (corresponding to) each screw hole 13, so as to be able to screw a screw 25 into each screw hole via each long hole 24. In a state where each screw 25 is screwed into the screw hole 13, the second waveguide member 20 can be displaced with respect to the second waveguide member 20 within a range of a length of the long hole 24 in a longitudinal direction (in the z-axis direction). In the present example, a central portion in the longitudinal direction of an external surface (the third surface M3) of the second waveguide member 20 having a rectangular shape becomes a concave part, and the connector attachment hole 22 is formed in this concave part. Each long hole 24 is formed in a convex part at the opposite sides of the concave part.

The position of the second waveguide member 20 facing the one surface 6a of the first waveguide member 10 can be finely adjusted within the length of the long hole 24, thereby enabling fine adjustment of an electric property of the antenna device 1. As a result, occurrence of disturbance in pass amplitude characteristics within the band and disturbance in return loss characteristics within the band due to total reflection can be suppressed.

The concave portion 11, which becomes the inner space 8, is a groove in which an inner surface formed in the center of the rectangular one surface 6a in the longitudinal direction of the first waveguide member 10 is formed by three surfaces orthogonal to each other, and is configured such that the second waveguide member 20 in an elongated plate shape can be attached to and detached from the one surface 6a by the screw 25. The inner space 8 is formed by fixing the second waveguide member 20 to the one surface 6a to close the concave portion 11.

The coaxial waveguide conversion unit 6 formed by assembling the second waveguide member 20 with respect to the first waveguide member 10 is a cuboid or a regular hexahedron configured by six surfaces, that is, the first surface M1 to the sixth surface M6 as described above.

The inner space 8 is formed so as to penetrate between the first surface M1 and the second surface M2 facing each other of the coaxial waveguide conversion unit 6. Further, in the third surface M3 orthogonal to the first surface and the second surface, the connector attachment hole 22 for inserting a coaxial connector, which is continuous to the inner space 8, is formed to penetrate therethrough. In the present example, the connector attachment hole 22 is formed to penetrate through the second waveguide member 20.

In the inner space 8, since an opening on the second surface side is closed (welded) by a conductive closure member, only the first surface M1 side is open.

The closure member 30 is formed with a hole 30a corresponding to a screw hole 10a provided on an external surface of the first waveguide member 10, and by inserting and screwing a screw 31 in a state where each screw hole 10a and each hole 30a is continuous to each other, the closure member 30 is tightly fixed to the external surface of the first waveguide member 10 without any space therebetween.

<Connector>

As illustrated in FIG. 1 to FIG. 4, the connector 50 is attached to the connector attachment hole 22 from the inner space 8 toward outside, and is configured by a connector body 51 that is conductive and is arranged to be exposed in a state where an inner end 56a is not protruding into the inner space 8, a center conductor 60 arranged to penetrate a central portion of the connector body in the y-axis direction, with an end portion 60a thereof protruding from the inner end 56a of the connector body into the inner space 8 by a predetermined length L, and a radiator 54b configured by the end portion 60a of the center conductor protruding into the inner space 8, to radiate radio waves from the center conductor into the inner space 8 by adapting the protruding length L (FIG. 4) of the end portion to a specific frequency band. An external thread is formed on an outer periphery at one end of the connector body 51. The connector body and the center conductor are integrated via an insulating material.

As described above, it is described that the radiator 54b radiates radio waves. However, this is an action at the time of transmission, and at the time of reception, the radiator 54b absorbs (receives) radio waves.

Figure 4:
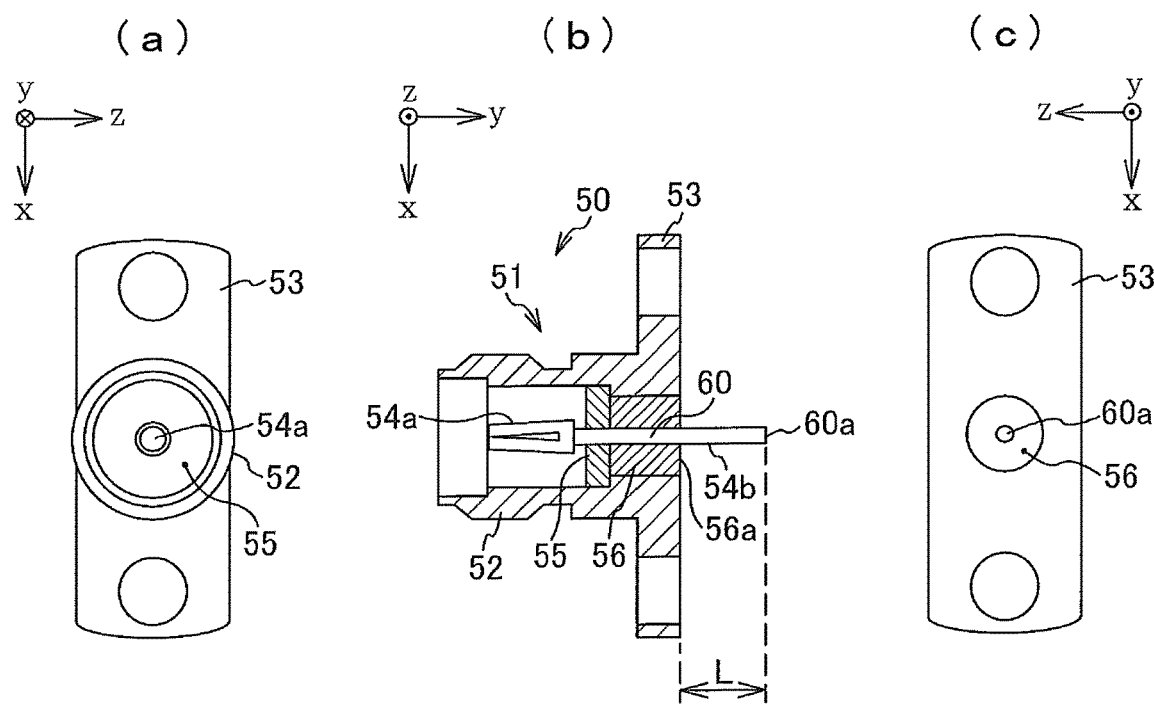
FIGS. 4(a), (b), and (c) are respectively a bottom view, a sectional view, and a top view of a connector according to the embodiment of the present invention.

As illustrated in FIG. 4, the connector body 51 of the connector 50 according to the present example generally includes a cylindrical connector socket 52 having a hollow shape and formed of a conductor and an insulator, a flange portion 53 formed at one end of the connector socket 52 integrally therewith, the center conductor 60 arranged to penetrate the connector socket 52 axially, a center-conductor support portion 55 that fixedly supports an appropriate portion of the center conductor 60 to an inner periphery of the connector socket 52, and an insulator 56 filled in a space between the center conductor 60 and the inner periphery of the connector socket 52 to fill the space.

A connector-socket contact portion 54a is provided at an outside end of the center conductor 60, and the radiator 54b being an element is provided at an inside end of the center conductor. The radiator 54b is a portion in which an end portion of the center conductor 60 is caused to protrude from the inside end surface of the connector socket 52 by a predetermined length, and by adjusting the length L of the element, tuning to a desired frequency band is performed.

The length L in the y-axis direction of the center conductor 60 of the connector 50 protruding from the inner end 56a is a length derived by multiplying a one-fourth wavelength of a specific frequency band by a predetermined fractional shortening 0.79. The specific frequency band is 23 GHz to 29 GHz to be used by a fifth generation terminal (5G).

Accordingly, the length L that can be tuned, specialized in the specific frequency band can be designed.

As illustrated in FIG. 3(a), in the present example, a concave part 23 for fitting thereto the flange portion 53 of the connector is formed on an inside surface (an opposite surface of the third surface M3) of the second waveguide member 20. When the flange portion 53 is fitted to and sits in the concave part 23 by inserting the connector socket 52 of the connector into the connector attachment hole 22, the size of an end face of the flange portion 53 is designed so as to be flush with an inside surface of the second waveguide member 20.

In this manner, the antenna device 1 closes the opening on the second surface side of the inner space 8 of the coaxial waveguide conversion unit 6 made of a conductive material by the conductive closure member 30 and the protruding length of the end portion 60a of the center conductor 60 protruding into the inner space 8 is adapted to a specific frequency band in the radiator 54b. Therefore, pass amplitude characteristics within a band and return loss characteristics can be tuned within the band, cutoff performance can be improved, and a favorable EVM value can be acquired.

An opening of the inner space 8 on the first surface M1 side, in other words, on a non-closed surface side, either the circularly polarized type polarization unit 100 that converts radio waves radiated from the radiator 54b into linearly polarized waves or circularly polarized waves, or the linearly polarized horn portion 200A that improves the gain and cuts off radio waves coming in from outside is connected to and arranged.

As illustrated in FIG. 10(d), the circularly polarized horn portion 200B may be connected to the inner space 8 via the circularly polarized type polarization unit 100. Accordingly, the circularly polarized type polarization unit 100 can easily acquire circular polarization characteristics, or the horn unit 200 can cut off radio waves coming in from outside and improve the gain.

<Circularly Polarized Type Polarization Unit>

FIGS. 5(a), (b), and (c) are respectively a front view, a top view, and a back view of the circularly polarized type polarization unit according to the embodiment of the present invention. FIGS. 6(a) and (b) are respectively a front view and a side view of a deflection plate. FIGS. 7(a), (b), and (c) are respectively C-C, D-D, and E-E sectional views of FIG. 5(a), and FIGS. 7(d) and (e) are respectively F-F and G-G sectional views of FIG. 7(b). Further, FIGS. 8(a) and (b) are respectively an external perspective view on a front side and a back side of the circularly polarized type polarization unit.

The circularly polarized type polarization unit 100 is connected to and arranged in the opening of the inner space 8 on the first surface M1 side.

The circularly polarized type polarization unit 100 is formed by providing a waveguide space 110 so as to penetrate through a rectangular (cuboid or regular hexahedron) block 101 made of a conductive material such as copper, iron, aluminum, brass, metamaterial, or plastic subjected to metal plating. That is, the waveguide space 110 is formed so as to penetrate two surfaces N1 and N2 of the block 101 facing each other.

In the present example, there is described an example in which a depth length L1 of the block 101 is 22 millimeters, a height L2 is 14 millimeters, and a width L3 is 24 millimeters.

The waveguide space 110 has a circular opening on a first surface N1 side, and an oblong rectangular opening on a second surface N2 side.

That is, the waveguide space 110 has a cylindrical shape having the same diameter (φ3.24 millimeters) from the opening side on the first surface N1 to a portion entering inside by 10 millimeters. The cylindrical waveguide space portion is referred to as "circular waveguide portion 120". In the circular waveguide portion 120, a deflection plate 140 having square shape and a thickness of 0.5 millimeter made of Teflon (registered trademark) (dielectric) is fixed in an oblique posture, passing through a circular central portion. That is, the length of the deflection plate 140 corresponds to the diameter of the circular waveguide portion 120.

Further, the waveguide space 110 has a substantially square columnar space from the opening side on the second surface N2 to a portion entering inside by 12 millimeters. The waveguide space portion is referred to as "rectangular waveguide portion 130".

The opening on the innermost side of the circular waveguide portion 120 and the opening on the innermost side of the rectangular waveguide portion 130 communicate with each other in a state where respective central axes A1 and A2 linearly come into alignment with each other.

Further, the circular opening on the innermost side of the circular waveguide portion 120 (a peripheral edge 121a) is not extended over the circular opening on the innermost side of the rectangular waveguide portion 130 (peripheral edges 131a, 132a), and terminates at a position of the opening on the innermost side of the rectangular waveguide portion 130. Therefore, the circular opening on the innermost side of the circular waveguide portion 120 (the peripheral edge 121a) and the circular opening on the innermost side of the rectangular waveguide portion 130 (the peripheral edges 131a, 132a) each have a circular shape coming into alignment with each other.

Therefore, the deflection plate 140 remains in the axial length of the circular waveguide portion 120, and is not extended over the circular opening on the innermost side of the rectangular waveguide portion 130.

The opening on the side of the second surface N2 (outside) of the rectangular waveguide portion 130 has a rectangular shape. However, an opening shape on the innermost side thereof is circular having the same shape and size as that of the (circular) opening on the innermost side of the circular waveguide portion 120. That is, two short sides 131 (4.3 millimeters) facing each other of the outside opening of the rectangular waveguide portion 130 are linear at the outside opening, but have an arc-like shape at the innermost portion 131a to come into alignment with the peripheral edge 121a of the opening (circular shape: φ8.24 millimeters) on the innermost side of the circular waveguide portion 120. That is, the arc-like innermost portion 131a of each short side 131 terminates at the peripheral edge of the (circular) opening on the innermost side of the circular waveguide portion 120.

Figure 5:
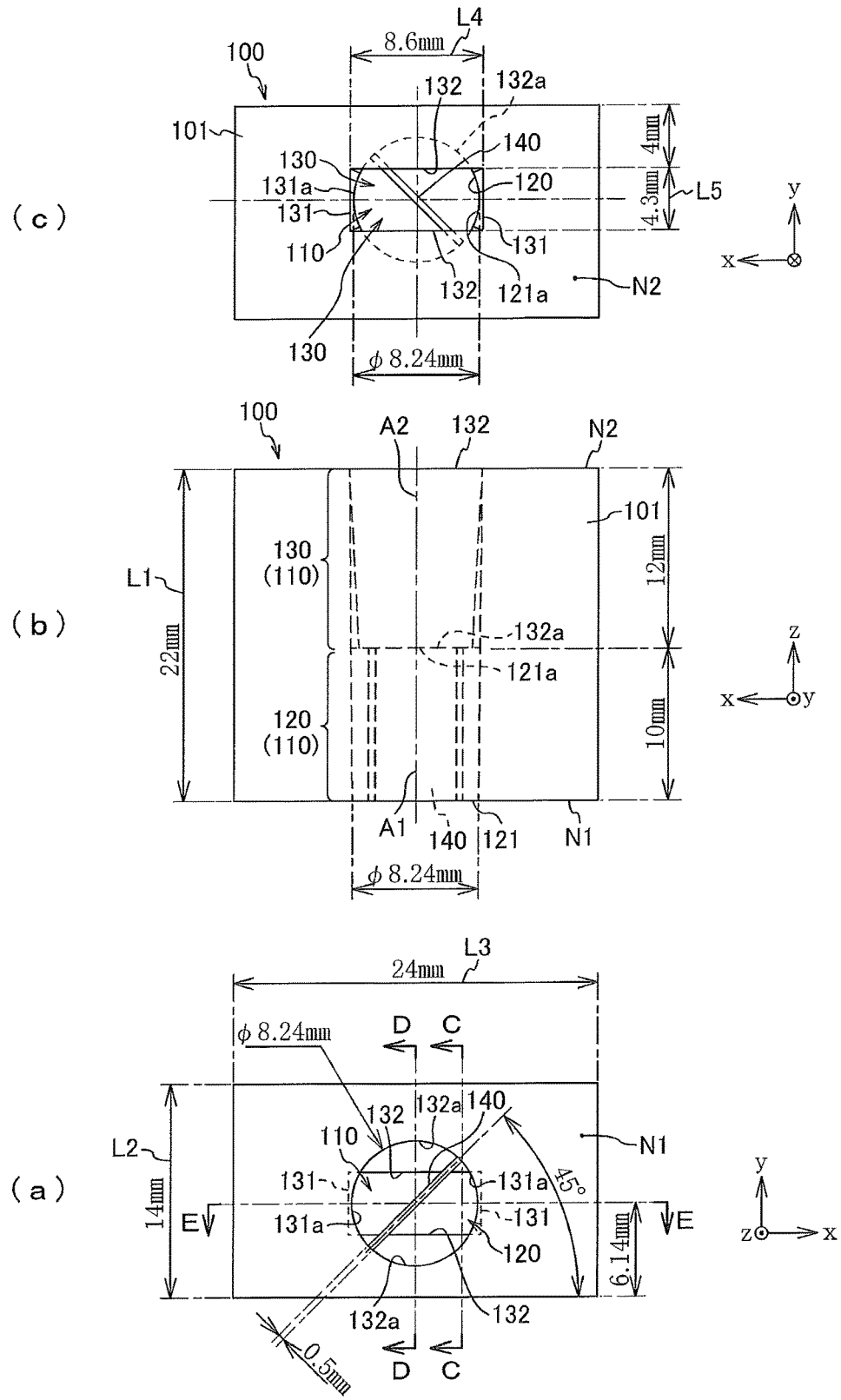
FIGS. 5(a), (b), and (c) are respectively a front view, a top view, and a back view of a circularly polarized type polarization unit according to the embodiment of the present invention.
Figure 6:
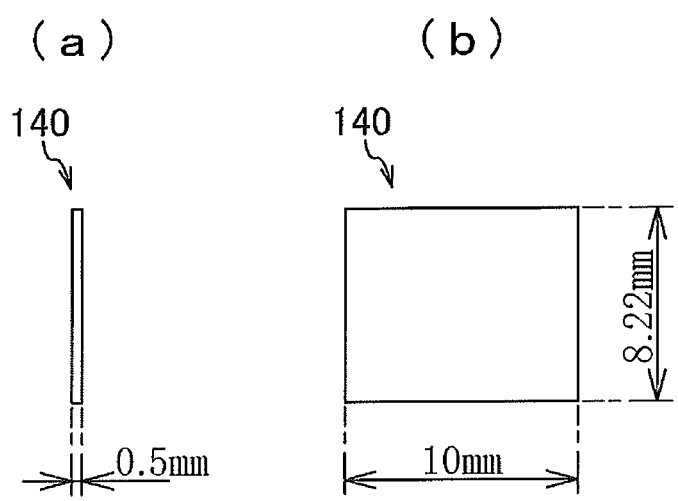
FIGS. 6(a) and (b) are respectively a front view and a side view of a deflection plate according to the embodiment of the present invention.
Figure 7:
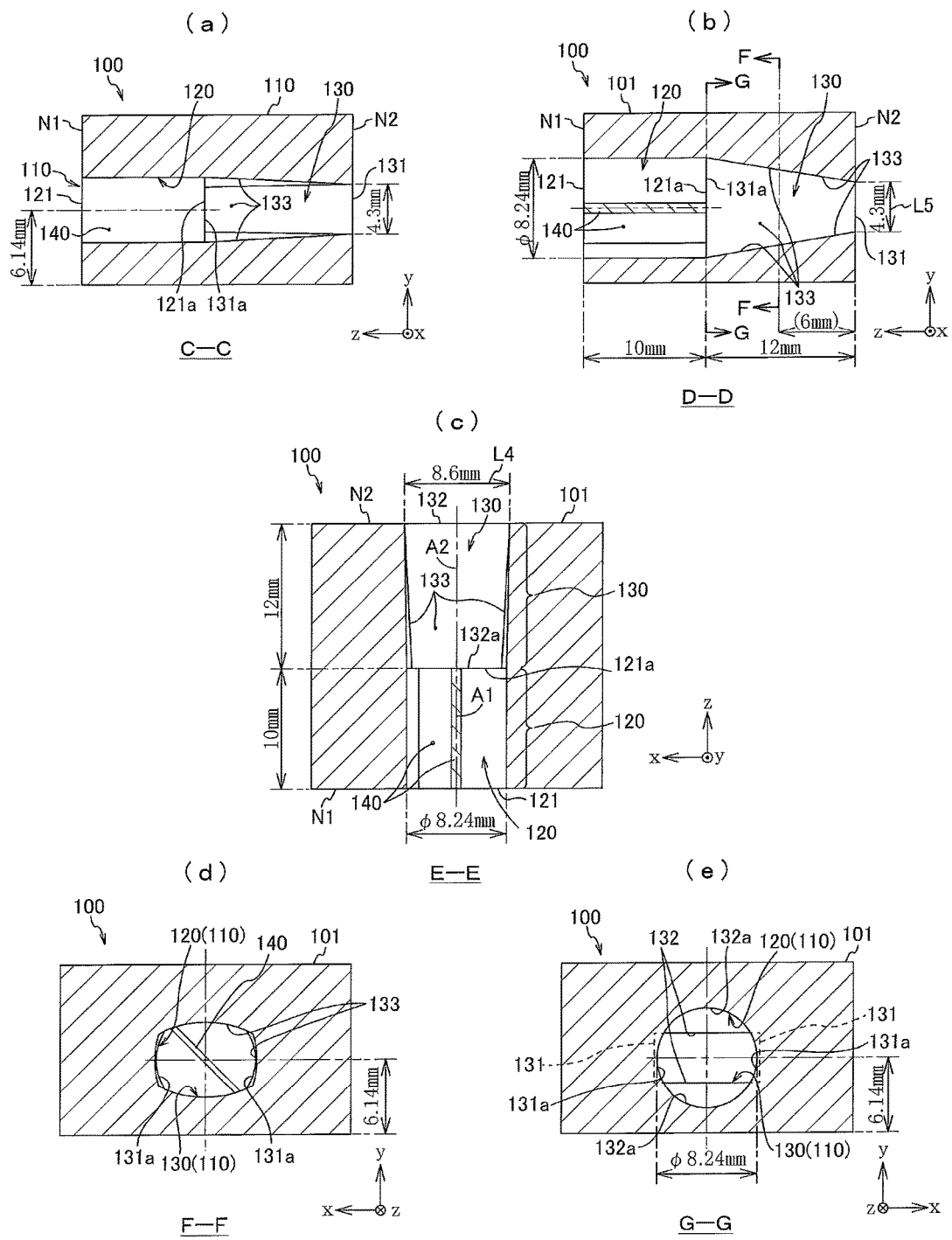
FIGS. 7(a), (b), and (c) are respectively C-C, D-D, and E-E sectional views of FIG. 5(a), and FIGS. 7(d) and (e) are respectively F-F and G-G sectional views of FIG. 7(b).

As illustrated in FIG. 5, FIG. 7, and FIG. 8, an interval L4 (8.6 millimeters) between the short sides 131 is slightly larger than the diameter (φ8.24 millimeters) of the opening on the innermost side of the circular waveguide portion 120. Therefore, the interval between the short sides gradually decreases (is narrowed) in a tapered shape as approaching toward the innermost portion, and finally, the innermost portions 131a of the short sides come into alignment with the peripheral edge of the (circular) opening on the innermost side of the circular waveguide portion 120.

Meanwhile, an interval L5 (4.3 millimeters) between long sides 132 facing each other of an external opening of the rectangular waveguide portion 130 is smaller than the diameter of the opening on the innermost side of the circular waveguide portion 120. Therefore, the interval L5 between the long sides gradually increases (is enlarged) in a tapered shape as approaching toward the innermost portion, and finally, the innermost portions 132a of the long sides come into alignment with the peripheral edge of the (circular) opening on the innermost side of the circular waveguide portion 120.

Since the innermost portion 131a of each short side 131 and the innermost portion 132a of each long side 132 are continuously provided in a circular shape, these portions form a circular shape coming into alignment with the opening on the innermost side of the circular waveguide portion 120.

Further, an inner wall 133 on the inner side of the rectangular waveguide portion 130 excluding a rectangular outside opening is in a curved shape as illustrated in FIG. 7 and FIG. 8.

The circularly polarized type polarization unit 100 formed as described above is connected to a non-closed surface side (an opening surface side) of the inner space 8 of the first waveguide member 10, to convert radio waves radiated from the radiator 54b into circularly polarized waves.

<Linearly Polarized Horn Portion 200A>

The linearly polarized horn portion 200A is connected to and arranged in the opening of the inner space 8 on the first surface M1 side.

As illustrated in FIG. 1 to FIG. 3, the linearly polarized horn portion 200A is obtained by configuring a plate material made of copper, iron, aluminum, brass, metamaterial, or plastic subjected to metal plating in a horn shape as illustrated in the drawings. In the present example, by fixing and integrating side ends of four plate materials 201a to 201d (FIG. 3) in a trapezoidal shape, an opening at one end becomes a square shape having a small diameter, and an opening at the other end becomes a square shape having a large diameter.

The linearly polarized horn portion 200A forms linearly polarized waves by a truncated square pyramid-shaped horn. "Truncated" refers to a state or a shape in which a portion of a predetermined length from the top of the four-sided pyramid is cut by a surface orthogonal to the central axes A1 and A2.

In this manner, by forming linearly polarized waves by the truncated square pyramid-shaped linearly polarized horn portion 200A, the horn portion 200 can easily acquire linear polarization characteristics having directional characteristics, and radio waves coming in from outside of an orientation direction can be cut off and the gain can be improved.

<Circularly Polarized Horn Portion 200B>

FIG. 9(a) is an external perspective view illustrating a circularly polarized horn portion 200B of the antenna device according to another embodiment (16-mm horn) of the present invention, FIG. 9(b) is a front view, FIG. 9(c) is a side view, and FIG. 9(d) is a back view thereof. FIGS. 9(e), (f), and (g) are respectively a front view, a side view, and a back view of the circularly polarized horn portion 200B of the antenna device according to the other embodiment (15-mm horn) of the present invention.

The circularly polarized horn portion 200B has a truncated cone shape, and is connected to and arranged in a circular opening on the first surface N1 side of the circularly polarized type polarization unit 100.

A circular opening having a small diameter of the circularly polarized horn portion 200B has the same shape as the opening on the first surface N1 side of the circularly polarized type polarization unit 100, and is fixed thereto by welding or the like.

The circularly polarized horn portion 200B forms circularly polarized waves by the truncated cone-shaped horn. "Truncated" refers to a state or a shape in which a portion of a predetermined length from the top of the pyramid is cut by a surface orthogonal to the central axes A1 and A2.

In this manner, by forming circularly polarized waves by the truncated cone-shaped circularly polarized horn portion 200B, the horn portion 200 can easily acquire circular polarization characteristics having directional characteristics, and radio waves coming in from outside the orientation direction can be cut off and the gain can be improved.

<Modification of Antenna Device>

FIG. 10(a) to (d) are side views illustrating modifications of the antenna device according to the embodiment of the present invention. FIG. 11 is a table illustrating a configuration of the modifications of the antenna device according to the embodiment of the present invention.

FIG. 10(a) illustrates a configuration of a linear polarization coupler 1A including the coaxial waveguide conversion unit 6 and the connector 50. More specifically, the coaxial waveguide conversion unit 6 includes the first waveguide member 10, the second waveguide member 20, and the closure member 30.

FIG. 10(b) illustrates a configuration of a circular polarization coupler 1B including the circularly polarized type polarization unit 100 that converts radio waves to circularly polarized waves, the coaxial waveguide conversion unit 6, and the connector 50.

FIG. 10(c) illustrates a configuration of a linearly polarized high-gain high-isolation coupler 1C including the linearly polarized horn portion 200A, the coaxial waveguide conversion unit 6, and the connector 50.

FIG. 10(d) illustrates a configuration of a circularly polarized high-gain high-isolation coupler 1D including the circularly polarized horn portion 200B, the circularly polarized type polarization unit 100, the coaxial waveguide conversion unit 6, and the connector 50.

<Performance of Each Modification of Antenna Device>

The pass amplitude characteristics, the return loss characteristics, the EVM value, the gain, and the VSWR in each modification of the antenna device are illustrated in the following table.

TABLE 1

| Modifications of antenna device | Pass amplitude character- istics (dB) | Return loss character- istics (dB) | EVM value (%) | Gain (dB) | VSWR |
|---|---|---|---|---|---|
| Linear polarization coupler | 0-5 dB | −10 dB or less | Less than 2 | About −3 dB | 1.8 or less |
| Circular polarization coupler | 0-5 dB | −10 dB or less | Less than 2 | About −3 dB | 1.8 or less |
| Linearly polarized high-gain high-isolation coupler | 0-5 dB | −10 dB or less | Less than 2 | About 10 dB | 1.8 or less |
| Circularly polarized high-gain high-isolation coupler | 0-5 dB | −10 dB or less | Less than 2 | About 10 dB | 1.8 or less |

For the first waveguide member 10, a rectangular waveguide having a frequency band from 21.7 GHz to 33.0 GHz and an inner diameter of the inner space 8 of 8.636 mm×4.318 mm, and satisfying WR-34 of the EIA Standard is used.

In this manner, since the pass amplitude characteristics of radio waves radiated from the antenna device itself have a fluctuation range of 5 dB or less over the specific frequency band, the linearly polarized coupler 1A can acquire favorable pass amplitude characteristics of radio waves and EVM value.

Further, since the return loss characteristics in total reflection of radio waves radiated from the respective couplers (the antenna devices) have a fluctuation range of 10 dB or less over the specific frequency band, the respective couplers can acquire a favorable EVM value.

The linearly polarized high-gain high-isolation coupler 1C and the circularly polarized high-gain high-isolation coupler 1D each have favorable isolation property representing cutoff of radio waves coming in from outside, as an actual effect, and can prevent cross talk between two antennas even when an experiment is performed by arranging the present antenna at two positions on a mobile phone being an object to be measured.

The materials of the coaxial waveguide conversion unit 6, the circularly polarized type polarization unit 100, and the horn portion 200 are copper, iron, aluminum, brass, metamaterial, plastic subjected to metal plating, or plastic or resin subjected to metal coating. Therefore, occurrence of disturbance in pass amplitude characteristics within a band and disturbance in return loss characteristics within a band due to total reflection can be suppressed, and cutoff performance of radio waves from outside the orientation direction can be improved by having directional characteristics, and a favorable EVM value and gain can be acquired.

As a method of subjecting plastic or resin to metal coating, a CVD method (a chemical vapor deposition method), a PVD method (a physical vapor deposition method), a metallic wire spraying method, a metallic powder spraying method, and the like have been known.

<Antenna System and Instrumentation System>

FIG. 12(a) is a block diagram illustrating an antenna system and an instrumentation system using the antenna device according to the embodiment of the present invention. FIG. 12(b) is a perspective view illustrating a calibration kit to be used for calibration of the instrumentation system.

An antenna system 300 illustrated in FIG. 12(a) includes, as an antenna device, any one pair of linear polarization couplers 1A, circular polarization couplers 1B, linearly polarized high-gain high-isolation couplers 1C, and circularly polarized high-gain high-isolation couplers 1D, uses each antenna device as a first antenna device 301 and a second antenna device 303, and receives radio waves radiated from the first antenna device 301 by the second antenna device 303 arranged opposite to a radiation direction of the first antenna device 301.

An instrumentation system 310 includes a network analyzer 305 and a monitor 313, in which a coaxial cable 307 is connected to between a terminal P1 of the network analyzer 305 and a connector of the first antenna device 301, and a coaxial cable 309 is connected to between a terminal P2 and a connector of the second antenna device 303.

Further, a monitor cable 311 is connected to between a monitor terminal 305m of the network analyzer 305 and a terminal 313m of the monitor 313. For example, MS46322B manufactured by ANRITSU CORPORATION is used as the network analyzer 305.

The antenna device is arranged adjacent to (close to) an object to be measured, and is used for measuring, for example, radio waves radiated from the object to be measured. As the object to be measured, devices that generate electromagnetic waves such as a mobile phone and a mobile terminal is targeted, and a next-generation mobile phone (5G) that uses a frequency band of, for example, from 23 GHz to 29 GHz is targeted.

The instrumentation system 310 is suitable for measuring coupling characteristics and return loss characteristics between the first antenna device 301 and the second antenna device 303 provided in the antenna system 300.

In this manner, the antenna device 1 is arranged at a desired position with respect to an object to be measured or arranged close to the object to be measured, to receive radio waves radiated from the object to be measured. Since occurrence of disturbance in pass amplitude characteristics within a band and disturbance in return loss characteristics within the band due to total reflection is suppressed, a favorable EVM value can be acquired.

Further, the antenna device 1 is arranged at a desired position with respect to an object to be measured or arranged close to the object to be measured and is used, to radiate radio waves to the object to be measured. Since occurrence of disturbance in pass amplitude characteristics within a band and disturbance in return loss characteristics within the band due to total reflection is suppressed, favorable radio waves can be radiated to the object to be measured.

Further, by receiving radio waves radiated from the first antenna device 301 by the second antenna device 303 arranged opposite to the radiation direction of the first antenna device 301, occurrence of disturbance in pass amplitude characteristics within a band and disturbance in return loss characteristics within the band due to total reflection can be suppressed, thereby enabling to acquire a favorable EVM value.

Furthermore, by arranging an object to be measured between the first antenna device 301 and the second antenna device 303, when radio waves radiated from the object to be measured are received, or when radio waves are received by the object to be measured, the influence degree by the object to be measured can be measured.

In the instrumentation system 310 illustrated in FIG. 12(a), a calibration kit 320 illustrated in FIG. 12(b) is used for calibration.

The calibration kit 320 includes four connectors of a connector 320S (SHORT), a connector 320o (OPEN), a connector 320L (LOAD), and a connector 320T (THRU). For example, TOSLKF50A-40 manufactured by ANRITSU CORPORATION is used as the calibration kit 320.

<Calibration Procedure by Instrumentation System>

Figure 13:
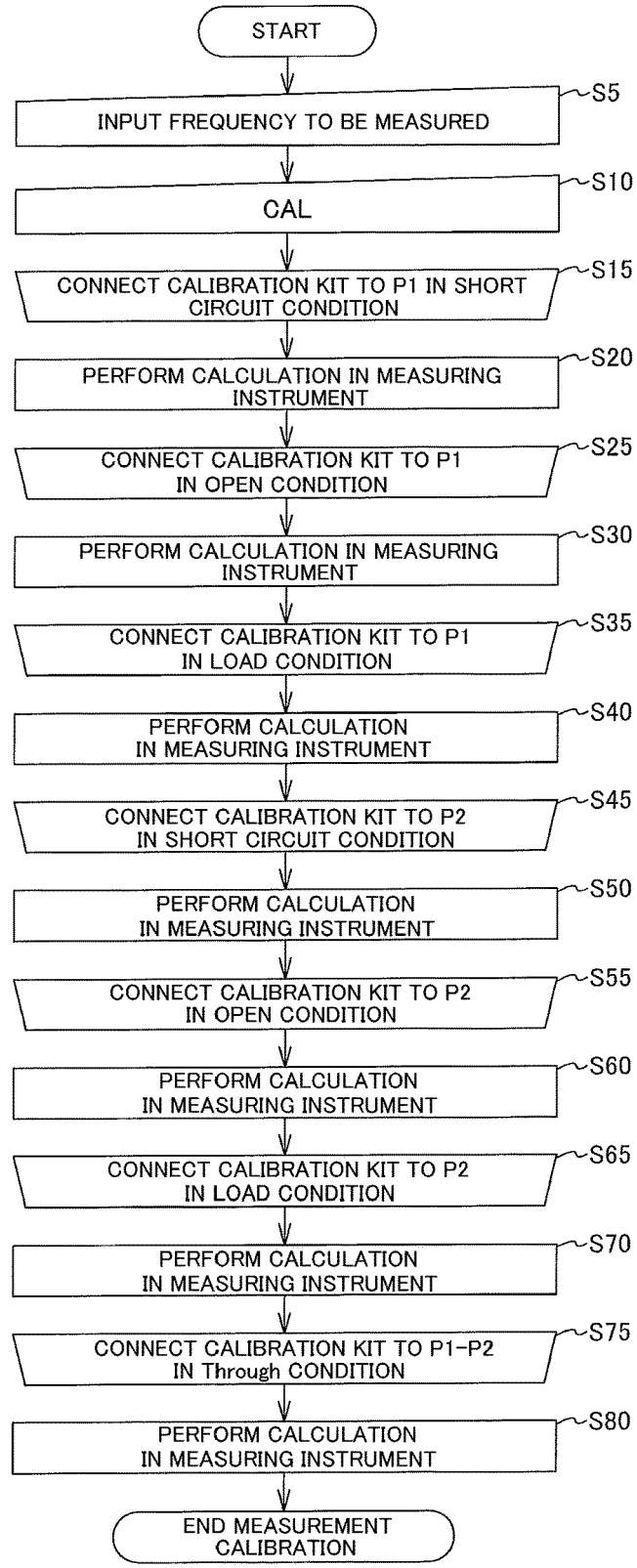
FIG. 13 is a flowchart illustrating a calibration procedure by the instrumentation system illustrated in FIG. 12.

FIG. 13 is a flowchart illustrating a calibration procedure by the instrumentation system illustrated in FIG. 12. Specifically, a calibration procedure performed in the instrumentation system 310 prior to measurement of return loss characteristics and coupling characteristics of the antenna device 1 is illustrated.

At step S5, a frequency to be measured (for example, 20 GHz to 30 GHz) is input to the network analyzer 305.

At step S10, the network analyzer 305 is set to a calibration CAL mode.

At step S15, the connector 320S of the calibration kit is connected to an end of the coaxial cable 307, which is connected to the terminal P1 of the network analyzer 305, to set the end of the coaxial cable 307 to a short circuit condition (SHORT).

At step S20, the network analyzer 305 performs calculation in a measuring instrument in response to operations of a user.

At step S25, the connector 320o of the calibration kit is connected to an end of the coaxial cable 307, which is connected to the terminal P1 of the network analyzer 305, to set the end of the coaxial cable 307 to an open condition (OPEN).

At step S30, the network analyzer 305 performs calculation in the measuring instrument in response to operations of the user.

At step S35, the connector 320L of the calibration kit is connected to the end of the coaxial cable 307, which is connected to the terminal P1 of the network analyzer 305, to set the end of the coaxial cable 307 to a load condition (LOAD) in which a load (for example, 50Ω) is connected to the end of the coaxial cable 307. At step S40, the network analyzer 305 performs calculation in the measuring instrument in response to operations of the user.

At step S45, the connector 320S of the calibration kit is connected to an end of the coaxial cable 309, which is connected to the terminal P2 of the network analyzer 305, to set the end of the coaxial cable 309 to a short circuit condition (SHORT).

At step S50, the network analyzer 305 performs calculation in the measuring instrument in response to operations of the user.

At step S55, the connector 320o of the calibration kit is connected to the end of the coaxial cable 309, which is connected to the terminal P2 of the network analyzer 305, to set the end of the coaxial cable 309 to an open condition (OPEN).

At step S60, the network analyzer 305 performs calculation in the measuring instrument in response to operations of the user.

At step S65, the connector 320L of the calibration kit is connected to the end of the coaxial cable 309, which is connected to the terminal P2 of the network analyzer 305, to set the end of the coaxial cable 309 to a load condition (LOAD) in which a load (for example, 50Ω) is connected to the end of the coaxial cable 309.

At step S70, the network analyzer 305 performs calculation in the measuring instrument in response to operations of the user.

At step S75, the connector 320T of the calibration kit is connected to the ends of the coaxial cables 307 and 309, which are connected respectively to the terminals P1 and P2 of the network analyzer 305, to set between the ends of the coaxial cables 307 and 309 to a through condition (THRU).

At step S80, the network analyzer 305 performs calculation in the measuring instrument in response to operations of the user.

As a result, amplitude characteristics, return loss characteristics, phase characteristics, and the like can be calibrated to be a flat condition in a set frequency band, with respect to the instrumentation system including the network analyzer 305, and the coaxial cables 307 and 309.

<Return Loss Measurement Procedure>

Figure 14:
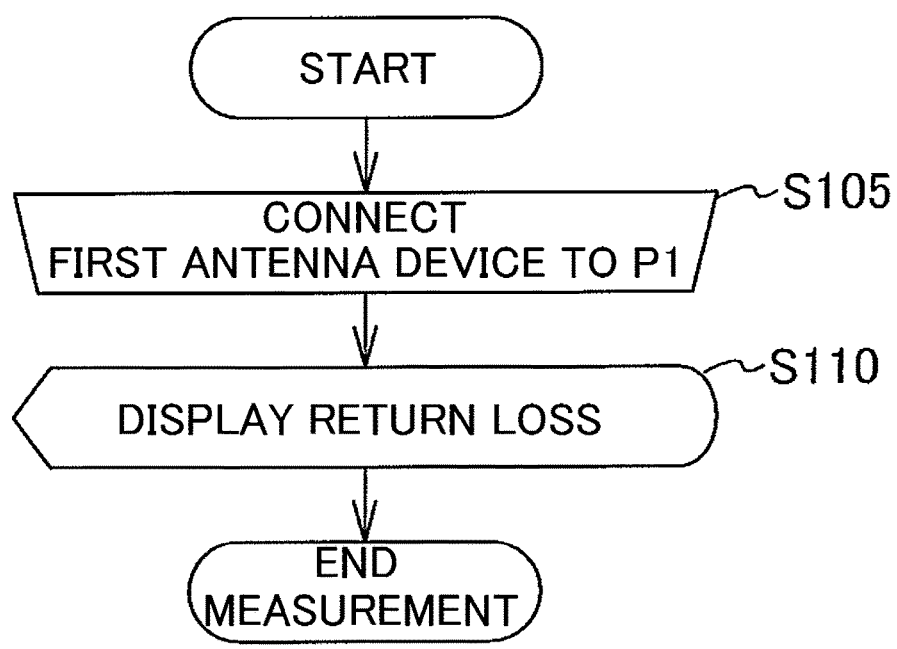
FIG. 14 is a flowchart illustrating a return loss measurement procedure performed in the instrumentation system illustrated in FIG. 12.

FIG. 14 is a flowchart illustrating a return loss measurement procedure performed in the instrumentation system illustrated in FIG. 12.

At step S105, the connector of the first antenna device 301 is connected to the end of the coaxial cable 307, which is connected to the terminal P1 of the network analyzer 305, to set the end of the coaxial cable 307 to a measurable condition.

At step S110, the network analyzer 305 performs calculation in the measuring instrument in response to operations of the user, and displays a return loss on the monitor 313. At this time, power during sweeping in a frequency band output from the terminal P1 of the network analyzer 305 is reflected by the first antenna device 301, and power returned from the first antenna device 301 is measured.

<Representative Characteristics Immediately after Assembly, and Representative Characteristics after Adjustment>

FIGS. 15(a) and (b) are graphs respectively illustrating representative characteristics immediately after assembly, and representative characteristics after adjustment of the linear polarization coupler 1A.

In the representative characteristics immediately after assembly of the linear polarization coupler 1A illustrated in FIG. 15(a), in a frequency band from 23 GHz to 29 GHz, return loss characteristic values concentrate at a level near −10 dB, and strong resonance of −35 dB or less occurs near 23 GHz.

Therefore, by attaching the second waveguide member 20 opposite to the one surface 6a of the first waveguide member 10 so as to be able to finely adjust the position of the second waveguide member 20, the position of the end portion 60a of the center conductor 60 protruding into the inner space 8 can be finely adjusted. As a result, occurrence of disturbance in pass amplitude characteristics within a band and disturbance in return loss characteristics within the band due to total reflection can be suppressed.

As a result, in the representative characteristics after adjustment of the linear polarization coupler 1A illustrated in FIG. 15(b), in the frequency band from 25 GHz to 29 GHz, the return loss characteristic value is improved to a level near −15 dB, and strong resonance is also improved to a level of −30 dB.

<Measurement Procedure of Coupling Loss Characteristics>

Figure 16:
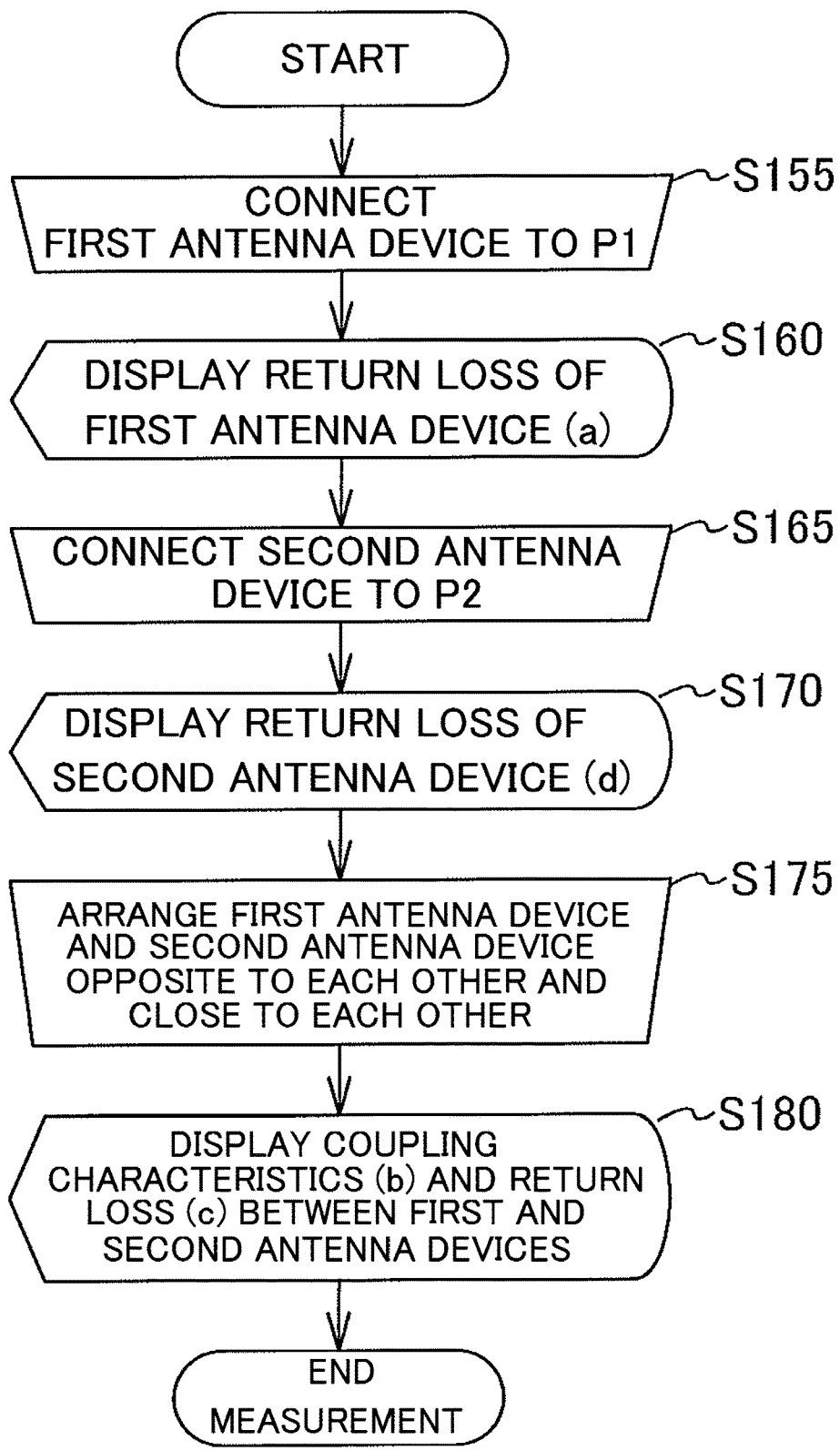
FIG. 16 is a flowchart illustrating a measurement procedure of coupling loss characteristics, performed in the instrumentation system illustrated in FIG. 12.

FIG. 16 is a flowchart illustrating a measurement procedure of coupling loss characteristics, performed in the instrumentation system illustrated in FIG. 12.

At step S155, the connector of the first antenna device 301 is connected to the end of the coaxial cable 307, which is connected to the terminal P1 of the network analyzer 305, to set the end of the coaxial cable 307 to a measurable condition.

At step S160, the network analyzer 305 performs calculation in the measuring instrument and displays a return loss of the first antenna device 301 on the monitor 313 (FIG. 17(a)).

At step S165, the connector of the second antenna device 303 is connected to the end of the coaxial cable 309, which is connected to the terminal P2 of the network analyzer 305, to set the end of the coaxial cable 309 to a measurable condition.

At step S170, the network analyzer 305 performs calculation in the measuring instrument and displays a return loss of the second antenna device 303 on the monitor 313 (FIG. 17(d)).

At step S175, the first antenna device 301 and the second antenna device 303 are arranged opposite to each other and adjacent to (close to) each other.

At step S180, the network analyzer 305 performs calculation in the measuring instrument and displays coupling characteristics between the first antenna device 301 and the second antenna device 303 (FIG. 17(b)), and a return loss (FIG. 17(c)) on the monitor 313.

<Measurement Results of Return Loss Characteristics and Coupling Characteristics>

FIGS. 17(a) to (d) are graphs illustrating results of measurement of return loss characteristics and coupling characteristics performed in the instrumentation system.

In the return loss characteristics of the first antenna device 301 illustrated in FIG. 17(a), a level of −10 dB or less is indicated in the frequency band from 23 GHz to 29 GHz.

In the return loss characteristics of the second antenna device 303 illustrated in FIG. 17(d), a level of −10 dB or less is indicated in the frequency band from 23 GHz to 29 GHz.

On the other hand, on the first antenna device side of the coupling characteristics between the first antenna device 301 and the second antenna device 303 illustrated in FIG. 17(b), a fluctuation range is suppressed to a level difference of within about 3 dB in the frequency band from 23 GHz to 29 GHz, and extremely flat coupling characteristics are illustrated.

Meanwhile, on the second antenna device side of the coupling characteristics between the first antenna device 301 and the second antenna device 303 illustrated in FIG. 17(c), a fluctuation range is suppressed to a level difference of within about 3 dB in the frequency band from 23 GHz to 29 GHz, and extremely flat return loss characteristics are illustrated.

<Antenna System and Instrumentation System Related to EVM Measurement>

Figure 18:
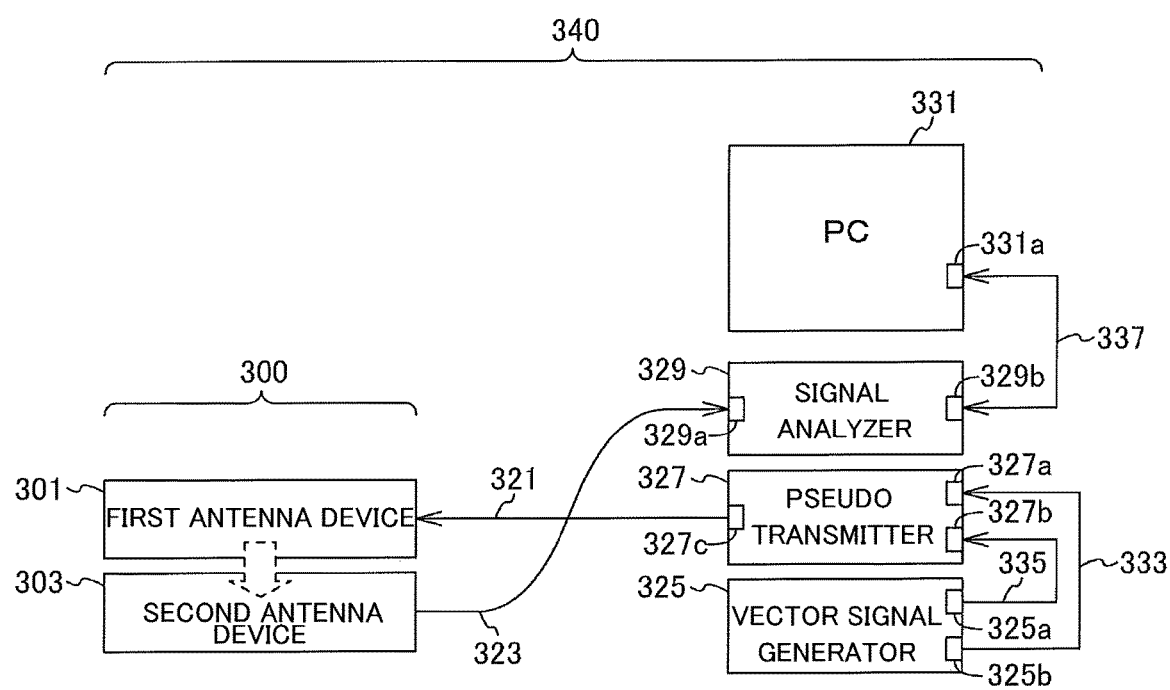
FIG. 18 is a block diagram illustrating an antenna system and an instrumentation system related to EVM measurement using the antenna device according to the embodiment of the present invention.

FIG. 18 is a block diagram illustrating an antenna system and an instrumentation system related to EVM measurement using the antenna device according to the embodiment of the present invention.

The antenna system 300 illustrated in FIG. 18 includes, as an antenna device, any one pair of linear polarization couplers 1A, circular polarization couplers 1B, linearly polarized high-gain high-isolation couplers 1C, and circularly polarized high-gain high-isolation couplers 1D, uses each antenna device as the first antenna device 301 and the second antenna device 303, and receives radio waves radiated from the first antenna device 301 by the second antenna device 303 arranged opposite to the radiation direction of the first antenna device 301.

An instrumentation system 340 includes a vector signal generator 325, a pseudo transmitter 327, a signal analyzer 329, and a personal computer PC 331. A coaxial cable 335 is connected to between a terminal 325a of the vector signal generator 325 and a terminal 327a of the pseudo transmitter 327, and a coaxial cable 333 is connected to between a terminal 325b of the vector signal generator 325 and a terminal 327b of the pseudo transmitter 327. For example, MG3710A and MS2850A manufactured by ANRITSU CORPORATION are respectively used as the vector signal generator 325 and the signal analyzer 329.

A coaxial cable 321 is connected to between a terminal 327c of the pseudo transmitter 327 and a connector of the first antenna device 301.

A coaxial cable 323 is connected to between a connector of the second antenna device 303 and a terminal 329a of the signal analyzer 329.

Further, a USB cable 137 is connected to between a USB terminal 329m of a terminal 329b of the signal analyzer 329 and a USB terminal 331a of the personal computer PC 331.

The antenna device is arranged adjacent to (close to) an object to be measured, and is used for measuring, for example, radio waves radiated from the object to be measured. As the object to be measured, devices that generate electromagnetic waves such as a mobile phone and a mobile terminal is targeted, and a next-generation mobile phone (5G) that uses a frequency band of, for example, from 23 GHz to 29 GHz is targeted.

The instrumentation system 340 is suitable for measuring EVM characteristics between the first antenna device 301 and the second antenna device 303 provided in the antenna system 300, and between the object to be measured and the second antenna device 303.

<Calibration Procedure of EVM Measurement>

Figure 19:
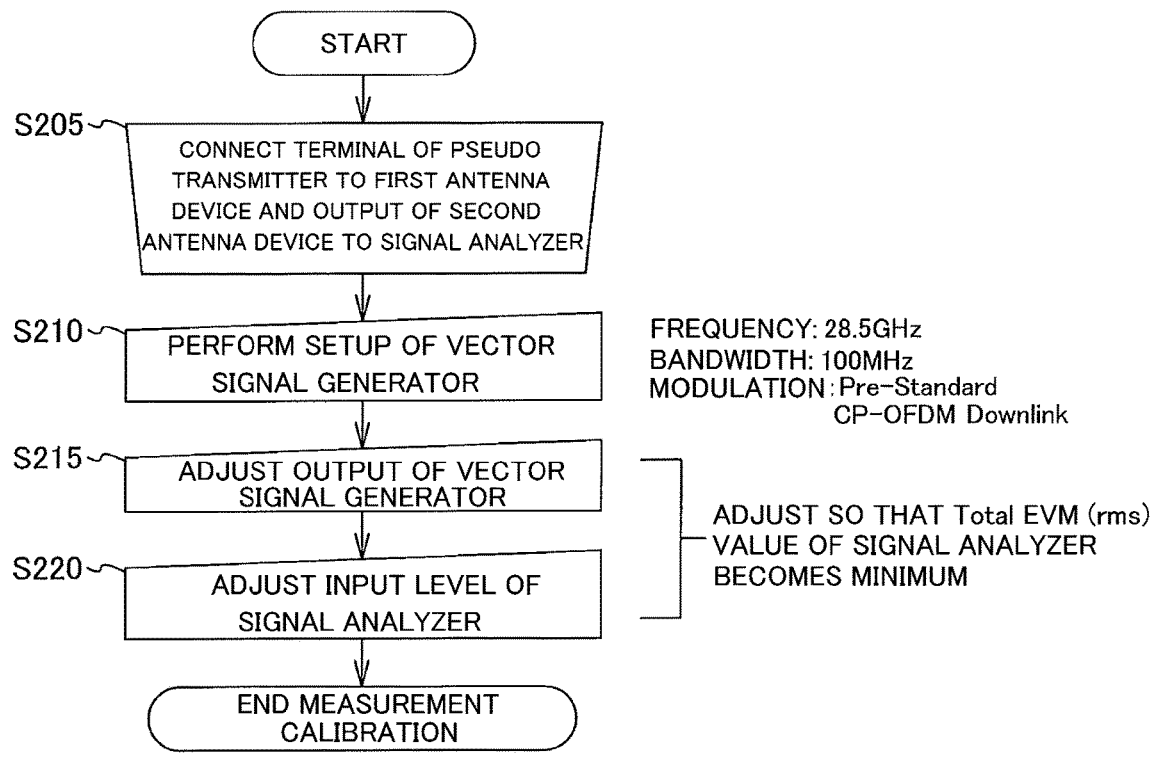
FIG. 19 is a flowchart illustrating a calibration procedure performed in the instrumentation system illustrated in FIG. 18.

FIG. 19 is a flowchart illustrating a calibration procedure performed in the instrumentation system illustrated in FIG. 18.

At step S205, the coaxial cable 321 connected to the terminal 327c of the pseudo transmitter 327 is connected to the first antenna device 301, and the coaxial cable 323 connected to the connector of the second antenna device 303 is connected to the terminal 329a of the signal analyzer 329.

At step S210, as respective setup of the vector signal generator 325, the frequency is set to 28.5 GHz, the bandwidth is set to 100 MHz, and the modulation is set to a Pre-Standard CP-OFDM Downlink.

At step S215, an output level of the vector signal generator 325 is adjusted.

At step S220, an input level of the signal analyzer 329 is adjusted.

At step S215 and step S220, it is adjusted so that the Total EVM (rms) value (FIG. 21) of the signal analyzer 329 displayed on a monitor of the personal computer PC 331 becomes minimum.

In the EVM measurement by coupling of the antenna devices, it is required to set the EVM value to 1% or less (better as being closer to 0%). It is to provide reliability to a measurement value at the time of actually measuring the EVM value of the fifth generation terminal (5G), and if the EVM value exceeds 1%, there is no reliability.

Therefore, it is required to set such that a waveform of the coupling characteristics of the antenna devices is flat, the EVM value at the time of coupling is 1% or less, and there is no disturbance in the waveform at the time of total reflection of the antenna device.

<EVM Measurement Procedure>

Figure 20:
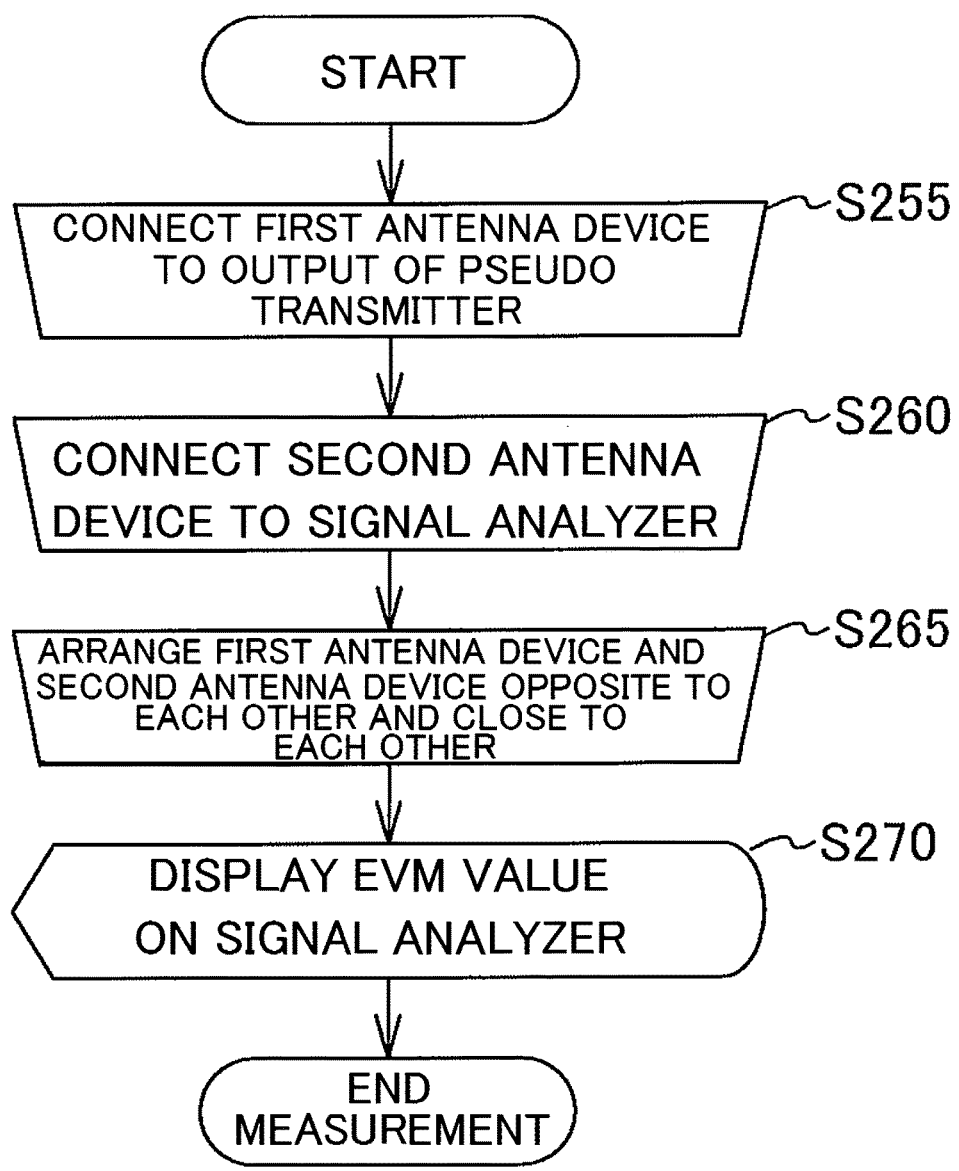
FIG. 20 is a flowchart illustrating an EVM measurement procedure performed in the instrumentation system illustrated in FIG. 18.

FIG. 20 is a flowchart illustrating an EVM measurement procedure performed in the instrumentation system illustrated in FIG. 18.

At step S255, the coaxial cable 321 connected to the terminal 327c of the pseudo transmitter 327 is connected to the first antenna device 301.

At step S260, the coaxial cable 323 connected to the connector of the second antenna device 303 is connected to the terminal 329a of the signal analyzer 329.

At step S265, the first antenna device 301 and the second antenna device 303 are arranged opposite to each other and adjacent to (close to) each other.

At step S270, the EVM value (FIG. 21) is displayed on a monitor of the signal analyzer 329.

Figure 21:
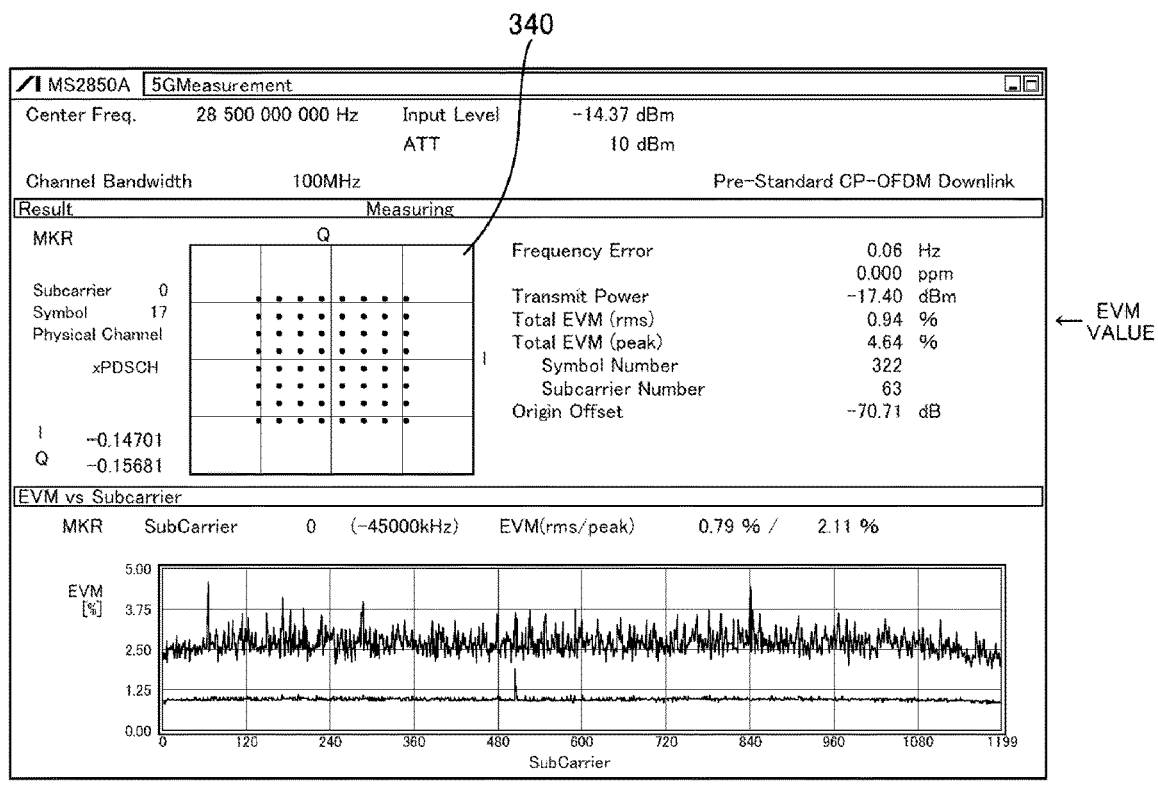
FIG. 21 is a diagram illustrating a monitor screen indicating an EVM value measured in the instrumentation system illustrated in FIG. 18.

Here, FIG. 21 is a diagram illustrating a monitor screen indicating the EVM value measured in the instrumentation system illustrated in FIG. 18.

Here, the EVM value indicates modulation accuracy, and is represented by percentage by calculating how much deviation has occurred in an actual signal symbol point with respect to an ideal symbol point (not illustrated). If multi-bit modulation is performed in digital communication, the number of symbols increases, and requirement of modulation accuracy becomes strict. If the modulation accuracy is poor, that is, the EVM value is not good, the symbol point (FIG. 21, reference numeral 340) is disrupted, and indicates that the communication quality of the digital communication is not good. In the worst case, communication becomes impossible.

<Return Loss Characteristics in Free Space of Linear Polarization Coupler>

FIG. 22(a) is a graph illustrating a result of measurement of return loss characteristics in a free space of the linear polarization coupler, performed in the instrumentation system.

In the return loss characteristics in the free space of the linear polarization coupler 1A illustrated in FIG. 22(a), the return loss is −10 dB or less, and an execution value is −15 dB or less, in the target frequency band from 23 GHz to 29 GHz.

<Coupler Coupling Characteristics of Linear Polarization Coupler>

FIG. 22(b) is a graph illustrating a result of measurement of coupler coupling characteristics (pass amplitude characteristics) of the linear polarization coupler performed in the instrumentation system.

A pair of linear polarization couplers 1A are coupled with each other at about −10 dB, the pass amplitude characteristics are within a fluctuation range of about 5 dB in the target frequency band from 23 GHz to 29 GHz, and extremely flat coupling characteristics are indicated without conventional steep waveform disturbance (FIG. 27(b)).

<Return Loss Characteristics in Total Reflection of Linear Polarization Coupler>

FIG. 23(a) is a graph illustrating a result of measurement of return loss characteristics in total reflection of the linear polarization coupler, performed in the instrumentation system.

When the entire surface of the opening of the linear polarization coupler 1A is covered with a metallic plate, a fluctuation range of the return loss characteristics is within a range of about 10 dB in the target frequency band from 23 GHz to 29 GHz, and extremely flat return loss characteristics are indicated without conventional steep waveform disturbance (FIG. 27(c)).

<EVM Value of Linear Polarization Coupler>

FIG. 23(b) is a graph illustrating a result of measurement of the EVM value of the linear polarization coupler, performed in the instrumentation system.

When a pair of linear polarization couplers 1A are coupled with each other with a coupling distance of 0 millimeter, for example, a favorable EVM value of equal to or less than EVM (rms) 1% is indicated, for example, in a frequency of 28.5 GHz.

<Return Loss Characteristics in Free Space of Linearly Polarized High-Gain High-Isolation Coupler>

FIG. 24(a) is a graph illustrating a result of measurement of return loss characteristics in a free space of the linearly polarized high-gain high-isolation coupler, performed in the instrumentation system.

In the return loss characteristics in a free space of the linearly polarized high-gain high-isolation coupler 1C illustrated in FIG. 24(a), the return loss is −10 dB or less, and an execution value is −13 dB or less, in the target frequency band from 23 GHz to 29 GHz.

<Coupler Coupling Characteristics of Linearly Polarized High-Gain High-Isolation Coupler>

FIG. 24(b) is a graph illustrating a result of measurement of coupler coupling characteristics (pass amplitude characteristics) of the linearly polarized high-gain high-isolation coupler, performed in the instrumentation system.

The linearly polarized high-gain high-isolation coupler 1C and the linearly polarized high-gain high-isolation coupler 1C are coupled with each other at about −10 dB, the pass amplitude characteristics are within a range of about 5 dB in the target frequency band from 23 GHz to 29 GHz, and extremely flat coupling characteristics are indicated without conventional steep waveform disturbance (FIG. 27(b)).

<Return Loss Characteristics in Total Reflection of Linearly Polarized High-Gain High-Isolation Coupler>

FIG. 25(a) is a graph illustrating a result of measurement of return loss characteristics in total reflection of the linearly polarized high-gain high-isolation coupler, performed in the instrumentation system.

When the entire surface of the opening of the linearly polarized high-gain high-isolation coupler 1C is covered with a metallic plate, a fluctuation range of the return loss characteristics is within a range of about 10 dB in the target frequency band from 23 GHz to 29 GHz, and extremely flat return loss characteristics are indicated without conventional steep waveform disturbance (FIG. 27(c)).

<EVM Value of Linearly Polarized High-Gain High-Isolation Coupler>

FIG. 25(b) is a graph illustrating a result of measurement of the EVM value of the linearly polarized high-gain high-isolation coupler, performed in the instrumentation system.

When a pair of linearly polarized high-gain high-isolation couplers 1C are coupled with each other with a coupling distance of 0 millimeter, for example, a favorable EVM value of equal to or less than EVM (rms) 1% is indicated, for example, in a frequency of 28.5 GHz.

<Return Loss Characteristics in Total Reflection of Linearly Polarized High-Gain High-Isolation Coupler after Adjustment>

FIG. 26(a) is a graph illustrating a result of measurement of return loss characteristics in total reflection of the linearly polarized high-gain high-isolation coupler, performed in the instrumentation system after fine adjustment is performed.

When the entire surface of the opening of the linearly polarized high-gain high-isolation coupler 1C is covered with a metallic plate, a fluctuation range of the return loss characteristics is within a range of about 15 dB in the frequency band from 23 GHz to 43 GHz, and extremely flat return loss characteristics are indicated without conventional steep waveform disturbance (FIG. 27(c)).

<VSWR Characteristics of Linearly Polarized High-Gain High-Isolation Coupler after Adjustment>

FIG. 26(b) is a graph illustrating a result of measurement of VSWR characteristics of the linearly polarized high-gain high-isolation coupler, performed in the instrumentation system after fine adjustment is performed.

When a sweep signal of 0 dBm is input to the linearly polarized high-gain high-isolation coupler 1C, the VSWR characteristics are within a range of equal to or less than 1.8 in the frequency band from 23 GHz to 43 GHz, and indicate remarkably satisfactory VSWR characteristics.

<Coupler Coupling Characteristics of Linearly Polarized High-Gain High-Isolation Coupler after Adjustment>

FIG. 26(c) is a graph illustrating a result of measurement of coupler coupling characteristics (pass amplitude characteristics) of the linearly polarized high-gain high-isolation coupler, performed in the instrumentation system after fine adjustment is performed.

The linearly polarized high-gain high-isolation coupler 1C and the linearly polarized high-gain high-isolation coupler 1C are coupled with each other at around −10 dB, the pass amplitude characteristics are within a range of about 5 dB in the frequency band from 23 GHz to 43 GHz, and extremely flat coupling characteristics are indicated without conventional steep waveform disturbance (FIG. 27(b)).

<Summary of Action and Effects of Aspects of Present Embodiment>

<First Aspect>

The antenna device 1 according to the present aspect includes the waveguide body 5 including a coaxial waveguide conversion unit 6 that is hexahedral and is made of a conductive material and including the inner space 8 formed by penetrating the first surface M1 and the second surface M2 facing each other, and the connector attachment hole 22 for inserting a coaxial connector continuously formed (to penetrate) between the third surface M3 orthogonal to the first surface M1 and the second surface M2 and the inner space 8, and the closure member 30 that is conductive and that closes an opening of the inner space 8 on the second surface side. The antenna device 1 also includes the connector 50 including the connector body 51 that is conductive and is attached to the connector attachment hole 22 from the inner space toward outside, with an inner end thereof not protruding into the inner space 8, the center conductor 60 arranged to axially penetrate a central portion of the connector body 51, with an end portion thereof protruding from the inner end of the connector body 51 into the inner space 8 by a predetermined length, and the radiator 54b configured by the end portion 60a of the center conductor 60 protruding into the inner space 8, to radiate radio waves from the center conductor into the inner space 8 by adapting the protruding length of the end portion 60a to a specific frequency band.

According to the present aspect, the opening of the inner space 8 on the second surface side of the coaxial waveguide conversion unit 6 made of a conductive material is closed by the conductive closure member 30, and the protruding length of the end portion 60a of the center conductor 60 protruding into the inner space 8 is adapted to a specific frequency band in the radiator 54b.

Accordingly, disturbance of pass amplitude characteristics within a band and return loss characteristics can be tuned into the band, and cutoff performance can be improved, thereby further enabling to acquire a favorable EVM value.

<Second Aspect>

The antenna device 1 according to the present aspect includes the circularly polarized type polarization unit 100 connected to the non-closed surface side (the opening surface side) of the inner space 8 of the coaxial waveguide conversion unit 6 to convert radio waves radiated from the radiator 54b into circularly polarized waves, or the horn portion 200 connected to the non-closed surface side (the opening surface side) of the inner space 8 directly or via the circularly polarized type polarization unit 100 to cut off radio waves coming in from outside.

According to the present aspect, radio waves radiated from the radiator 54b are converted into circularly polarized waves by the circularly polarized type polarization unit 100, or the horn portion 200 is connected to the non-closed surface side of the inner space 8 via the circularly polarized type polarization unit 100 to have directional characteristics, so that radio waves coming in from outside of the orientation direction can be cut off.

Accordingly, circular polarization characteristics can be easily acquired by the circularly polarized type polarization unit 100, or since the horn portion 200 has the directional characteristics, radio waves coming in from outside of the orientation direction can be cut off and the gain can be improved.

<Third Aspect>

The horn portion 200 according to the present aspect forms linearly polarized waves by the linearly polarized horn portion 200A having a truncated square pyramid shape, or forms circularly polarized waves by the circularly polarized horn portion 200B having a truncated cone shape.

According to the present aspect, by forming linearly polarized waves by the linearly polarized horn portion 200A or circularly polarized waves by the circularly polarized horn portion 200B, linear polarization characteristics or circular polarization characteristics can be acquired easily, and the horn portion has directional characteristics, and can cut off radio waves coming in from outside the orientation direction and improve the gain.

<Fourth Aspect>

The coaxial waveguide conversion unit 6 according to the present aspect includes the first waveguide member 10 having the concave portion 11 that forms the inner space 8 on the one surface 6a, and the second waveguide member 20 detachably attached to the one surface of the first waveguide member 10 to close the one surface side of the concave portion 11 to form the inner space 8, and a screw hole is formed each at positions having the concave portion 11 provided therebetween on the one surface of the first waveguide member 10, and the long hole 24 extending parallel to the axial direction of the inner space 8 is each formed at a position in the second waveguide member 20 coming into alignment with (corresponding to) each screw hole 13, so as to be able to screw a screw in each of the screw holes 13 via each of the long holes 24.

According to the present aspect, since it is configured such that a screw can be screwed to each of the screw holes 13 via each of the long holes 24 extending parallel to the axial direction of the inner space 8, the position of each screw hole 13 can be finely adjusted with respect to each of the long holes 24. As a result, occurrence of disturbance in pass amplitude characteristics within a band and disturbance in return loss characteristics within the band due to total reflection can be suppressed.

<Fifth Aspect>

The coaxial waveguide conversion unit 6 according to the present aspect can attach the second waveguide member 20 opposite to the one surface 6a of the first waveguide member 10 so as to be able to finely adjust the position thereof.

According to the present aspect, by attaching the second waveguide member 20 opposite to the one surface 6a of the first waveguide member 10, so as to be able to finely adjust the position thereof, the position of the end portion 60a of the center conductor 60 protruding into the inner space 8 can be finely adjusted. As a result, occurrence of disturbance in pass amplitude characteristics within a band and disturbance in return loss characteristics within the band due to total reflection can be suppressed.

<Sixth Aspect>

The axial length L protruding from the inner end 56a of the center conductor 60 of the coaxial connector according to the present aspect is a length derived by multiplying a one-fourth wavelength of a specific frequency band by a predetermined fractional shortening 0.79.

According to the present aspect, the length L can be designed so that it can be tuned, specialized in a specific frequency band.

<Seventh Aspect>

The horn portion 200 according to the present aspect includes the first inner space 8 having a longitudinal width of 4.3 millimeters and a horizontal width of 8.6 millimeters, and the second inner space 8 having a longitudinal width of 15 millimeters to 16 millimeters and a horizontal width of 15 millimeters to 16 millimeters.

According to the present aspect, since the horn portion 20 includes the first inner space 8 having the longitudinal width of 4.3 millimeters and the horizontal width of 8.6 millimeters, and the second inner space 8 having the longitudinal width of 15 millimeters to 16 millimeters and the horizontal width of 15 millimeters to 16 millimeters, a horn portion that can acquire a favorable gain, specialized in a specific frequency band from 23 GHz to 29 GHz can be created.

<Eighth Aspect>

The materials of the coaxial waveguide conversion unit 6, the circularly polarized type polarization unit 100, and the horn portion 200 are copper, iron, aluminum, brass, metamaterial, plastic subjected to metal plating, or plastic or resin subjected to metal coating.

According to the present aspect, since the coaxial waveguide conversion unit 6, the circularly polarized type polarization unit 100, and the horn portion 200 are made of a material such as copper, iron, aluminum, brass, metamaterial, plastic subjected to metal plating, or plastic or resin subjected to metal coating, occurrence of disturbance in pass amplitude characteristics within a band and disturbance in return loss characteristics within the band due to total reflection can be suppressed, cutoff performance can be improved, and further, a favorable EVM value can be acquired.

<Ninth Aspect>

The linear polarization coupler 1A (antenna device) according to the present aspect has the pass amplitude characteristics of radio waves radiated from the antenna device itself with a fluctuation range of 0 to 5 dB over a specific frequency band.

According to the present aspect, since the pass amplitude characteristics of radio waves radiated from the antenna device itself have a fluctuation range of within 5 dB over a specific frequency band, favorable pass amplitude characteristics of radio waves can be acquired.

<Tenth Aspect>

The fluctuation range of the return loss characteristics in total reflection of radio waves radiated from the antenna device 1 according to the present aspect is within 10 dB over a specific frequency band, and the return loss characteristics have a gradual waveform.

According to the present aspect, since the return loss characteristics in total reflection of radio waves radiated from the antenna device 1 indicate within 10 dB over a specific frequency band and have a gradual waveform, favorable return loss characteristics of radio waves can be acquired.

<Eleventh Aspect>

The specific frequency band according to the present aspect is from 23 GHz to 29 GHz.

According to the present aspect, since the specific frequency band according to the present aspect is from 23 GHz to 29 GHz, occurrence of disturbance in pass amplitude characteristics within a band and disturbance in return loss characteristics within the band due to total reflection can be suppressed, specialized in the frequency band, cutoff performance can be improved, and further, a favorable EVM value can be acquired.

<Twelfth Aspect>

The antenna device 1 according to the present aspect is arranged at a desired position with respect to an object to be measured, to receive radio waves radiated from the object to be measured.

According to the present aspect, the antenna device 1 is arranged at a desired position with respect to an object to be measured, and occurrence of disturbance in pass amplitude characteristics within a band and disturbance in return loss characteristics within the band due to total reflection is suppressed. Therefore, the antenna device 1 can be arranged close to the object to be measured, so as to be able to reliably receive radio waves radiated from the object to be measured, and perform measurement with a favorable EVM value. Further, since the antenna device 1 has directional characteristics, cutoff performance of radio waves from outside of the orientation direction can be improved, and a favorable gain can be acquired.

<Thirteenth Aspect>

The antenna device 1 according to the present aspect is arranged at a desired position with respect to an object to be measured, and radiates radio waves to the object to be measured.

According to the present aspect, the antenna device 1 is arranged at a desired position with respect to an object to be measured, and occurrence of disturbance in pass amplitude characteristics within a band and disturbance in return loss characteristics within the band due to total reflection is suppressed. Therefore, the antenna device 1 can acquire a favorable EVM value, and can be arranged close to the object to be measured to radiate radio waves. Further, by having the directional characteristics, radio waves can be radiated only in the orientation direction.

<Fourteenth Aspect>

The antenna system 300 according to the present aspect includes a pair of the antenna devices 1 according to any one of the first to the tenth aspects, each of the antenna devices 1 is designated as the first antenna device 301 and the second antenna device 302, and radio waves radiated from the first antenna device 301 is received by the second antenna device 303 arranged opposite to the radiation direction of the first antenna device 301.

According to the present aspect, occurrence of disturbance in pass amplitude characteristics within a band and disturbance in return loss characteristics within the band due to total reflection is suppressed, and a favorable EVM value can be acquired by receiving radio waves radiated from the first antenna device 301 by the second antenna device 303 arranged opposite to the radiation direction of the first antenna device 301.

<Fifteenth Aspect>

In the instrumentation system 340 according to the present aspect, an object to be measured is arranged between the first antenna device 301 and the second antenna device 303 provided in the antenna system 300 according to the fourteenth aspect.

According to the present aspect, by arranging an object to be measured between the first antenna device 301 and the second antenna device 303, when radio waves radiated from the object to be measured are received, or when radio waves are received by the object to be measured, the influence degree by the object to be measured can be measured.

REFERENCE SIGNS LIST 1 antenna device, 1A linear polarization coupler, 1B circular polarization coupler, 1C linearly polarized high-gain high-isolation coupler, 1D circularly polarized high-gain high-isolation coupler, 5 waveguide body, 6 coaxial waveguide conversion unit, 8 inner space, 10 first waveguide member, 10a screw hole, 11 concave portion, 13 screw hole, 20 waveguide member, 22 connector attachment hole, 23 concave part, 24 long hole, 25 screw, 30 closure member, 30a hole, 31 screw, 50 connector, 51 connector body, 52 connector socket, 53 flange portion, 54a connector-socket contact portion, 54b radiator, 55 center-conductor support portion, 56 insulator, 56a inner end, 60 center conductor, 60a end portion, 100 circularly polarized type polarization unit, 110 waveguide space, 120 circular waveguide portion, 121a peripheral edge, 130 rectangular waveguide portion, 131 short side, 131a peripheral edge, 132 long side, 132a innermost portion, 133 inner wall, 140 deflection plate, 200 horn portion, 200A linearly polarized horn portion, 200B circularly polarized horn portion, 201a plate material.

The invention claimed is:

1. An antenna device comprising:
a waveguide body including
a coaxial waveguide conversion unit that is hexahedral and is made of a conductive material and including an inner space formed by penetrating a first surface and a second surface facing each other, and a connector attachment hole continuously formed between a third surface orthogonal to the first surface and the second surface and the inner space, and
a closure member that is conductive and that closes an opening of the inner space on the second surface side; and
a connector including
a connector body that is conductive and is attached to the connector attachment hole from the inner space toward outside, with an inner end of the connector body not protruding into the inner space,
a center conductor arranged to axially penetrate a central portion of the connector body, with an end portion thereof protruding from the inner end of the connector body into the inner space by a predetermined length, and a radiator configured by the end portion of the center conductor protruding into the inner space, to radiate radio waves from the center conductor into the inner space by adapting the predetermined length to a specific frequency band, wherein the coaxial waveguide conversion unit includes a first waveguide member having a concave portion that forms the inner space on one surface, and a second waveguide member detachably attached to the one surface of the first waveguide member to close the one surface side of the concave portion to form the inner space, a screw hole is formed each at positions having the concave portion provided therebetween on the one surface of the first waveguide member, and a long hole extending parallel to the axial direction of the inner space is each formed at a position in the second waveguide member coming into alignment with each screw hole, so as to be able to screw a screw in each of the screw holes via each of the long holes.

2. The antenna device according to claim 1, further comprising a polarization unit connected to a non-closed surface side of the inner space of the coaxial waveguide conversion unit to convert radio waves radiated from the radiator into circularly polarized waves, or a horn portion connected to the non-closed surface side of the inner space directly or via the polarization unit to cut off radio waves coming in from outside.

3. The antenna device according to claim 2, wherein the horn portion forms linearly polarized waves by a truncated square pyramid-shaped horn, or forms circularly polarized waves by a truncated cone-shaped horn.

4. The antenna device according to claim 3, wherein the axial length of the center conductor of the connector protruding from the inner end is a length derived by multiplying a one-fourth wavelength of the specific frequency band by a predetermined fractional shortening.

5. The antenna device according to claim 3, wherein the truncated square pyramid-shaped horn of the horn portion includes a first inner space having a longitudinal width of 4.3 millimeters and a horizontal width of 8.6 millimeters, and a second inner space having a longitudinal width of 15 millimeters to 16 millimeters and a horizontal width of 15 millimeters to 16 millimeters.

6. The antenna device according to claim 2, wherein the coaxial waveguide conversion unit, the polarization unit, and the horn portion are made of a material such as copper, iron, aluminum, brass, metamaterial, plastic subjected to metal plating, or plastic or resin subjected to metal coating.

7. The antenna device according to claim 1, wherein the second waveguide member is attached so as to be able to finely adjust a position thereof opposite to one surface of the first waveguide member.

8. The antenna device according to claim 1, wherein pass amplitude characteristics of radio waves radiated from the antenna device itself indicate 0 to 5 dB over the specific frequency band.

9. The antenna device according to claim 1, wherein return loss characteristics in total reflection of radio waves radiated from the antenna device itself have a fluctuation range within 10 dB over the specific frequency band.

10. The antenna device according to claim 1, wherein the specific frequency band is from 23 GHz to 29 GHz.

11. The antenna device according to claim 1, wherein the antenna device is arranged at a desired position with respect to an object to be measured, to receive radio waves radiated from the object to be measured.

12. The antenna device according to claim 1, wherein the antenna device is arranged at a desired position with respect to an object to be measured, to radiate radio waves to the object to be measured.

13. An antenna system comprising a pair of antenna devices each comprising:

a waveguide body including a coaxial waveguide conversion unit that is hexahedral and is made of a conductive material and including an inner space formed by penetrating a first surface and a second surface facing each other, and a connector attachment hole continuously formed between a third surface orthogonal to the first surface and the second surface and the inner space, and a closure member that is conductive and that closes an opening of the inner space on the second surface side; and a connector including a connector body that is conductive and is attached to the connector attachment hole from the inner space toward outside, with an inner end of the connector body not protruding into the inner space, a center conductor arranged to axially penetrate a central portion of the connector body, with an end portion thereof protruding from the inner end of the connector body into the inner space by a predetermined length, and a radiator configured by the end portion of the center conductor protruding into the inner space, to radiate radio waves from the center conductor into the inner space by adapting the predetermined length to a specific frequency band, wherein the coaxial waveguide conversion unit includes a first waveguide member having a concave portion that forms the inner space on one surface, and a second waveguide member detachably attached to the one surface of the first waveguide member to close the one surface side of the concave portion to form the inner space, a screw hole is formed each at positions having the concave portion provided therebetween on the one surface of the first waveguide member, and a long hole extending parallel to the axial direction of the inner space is each formed at a position in the second waveguide member coming into alignment with each screw hole, so as to be able to screw a screw in each of the screw holes via each of the long holes, wherein each of the antenna devices is designated as a first antenna device and a second antenna device, and radio waves radiated from the first antenna device is received by the second antenna device arranged opposite to a radiation direction of the first antenna device.

14. An instrumentation system in which an object to be measured is arranged between the first antenna device and the second antenna device provided in the antenna system according to claim 13.

* * * * *